(12) United States Patent
Hong et al.

(10) Patent No.: US 12,199,042 B2
(45) Date of Patent: Jan. 14, 2025

(54) SEMICONDUCTOR DEVICE HAVING INTERCONNECTION LINES WITH DIFFERENT LINEWIDTHS AND METAL PATTERNS

(71) Applicant: Samsung Electronics Co., Ltd., Suwon-si (KR)

(72) Inventors: Wonhyuk Hong, Seoul (KR); Jongjin Lee, Seoul (KR); Rakhwan Kim, Suwon-si (KR); Eun-Ji Jung, Hwaseong-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 91 days.

(21) Appl. No.: 17/590,238

(22) Filed: Feb. 1, 2022

(65) Prior Publication Data
US 2022/0157736 A1 May 19, 2022

Related U.S. Application Data

(63) Continuation of application No. 16/940,933, filed on Jul. 28, 2020, now Pat. No. 11,270,944.

(30) Foreign Application Priority Data

Dec. 16, 2019 (KR) .......................... 10-2019-0167872

(51) Int. Cl.
*H01L 23/532* (2006.01)
*H01L 21/768* (2006.01)
(Continued)

(52) U.S. Cl.
CPC .. *H01L 23/53266* (2013.01); *H01L 21/76849* (2013.01); *H01L 21/76865* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 6,232,228 B1    5/2001  Kwag et al.
6,953,745 B2 *  10/2005 Ahn ................. H01L 21/76877
                                                257/E21.585
(Continued)

FOREIGN PATENT DOCUMENTS

JP    2002299343 A    10/2002
KR    100566698 B1     4/2006
(Continued)

OTHER PUBLICATIONS

Office Action dated Jul. 14, 2021 corresponding to U.S. Appl. No. 16/940,933.

*Primary Examiner* — Younes Boulghassoul
(74) *Attorney, Agent, or Firm* — Harness, Dickey & Pierce, P.L.C.

(57) ABSTRACT

A semiconductor device includes transistors on a substrate, a first interlayered insulating layer on the transistors, first and second lower interconnection lines in an upper portion of the first interlayered insulating layer, and first and second vias on the first and second lower interconnection lines, respectively. Each of the first and second lower interconnection lines includes a first metal pattern. The first lower interconnection line further includes a second metal pattern, on the first metal pattern with a metallic material different from the first metal pattern. The second metal pattern is absent in the second lower interconnection line. The second via includes first and second portions, which are in contact with respective top surfaces of the first interlayered insulating layer and the second lower interconnection line, and the
(Continued)

lowest level of a bottom surface of the second portion is lower than that of a bottom surface of the first via.

14 Claims, 36 Drawing Sheets

(51) Int. Cl.

| | | |
|---|---|---|
| *H01L 21/8234* | (2006.01) | |
| *H01L 21/8238* | (2006.01) | |
| *H01L 23/522* | (2006.01) | |
| *H01L 23/528* | (2006.01) | |
| *H01L 27/02* | (2006.01) | |
| *H01L 27/088* | (2006.01) | |
| *H01L 27/092* | (2006.01) | |
| *H01L 29/423* | (2006.01) | |
| *H01L 29/786* | (2006.01) | |

(52) U.S. Cl.
CPC .. *H01L 21/76877* (2013.01); *H01L 21/76883* (2013.01); *H01L 21/823431* (2013.01); *H01L 21/823871* (2013.01); *H01L 23/5226* (2013.01); *H01L 23/5283* (2013.01); *H01L 23/53238* (2013.01); *H01L 27/0207* (2013.01); *H01L 27/0886* (2013.01); *H01L 27/0924* (2013.01); *H01L 29/42392* (2013.01); *H01L 29/78696* (2013.01); *H01L 21/76897* (2013.01); *H01L 21/823475* (2013.01); *H01L 21/823821* (2013.01)

(58) Field of Classification Search
CPC ........... H01L 27/1211; H01L 27/10826; H01L 27/10879; H01L 29/41791; H01L 29/785–7856; H01L 2029/7857–7858; H01L 2924/13067; H01L 29/78696; H01L 29/42392; H01L 29/0673; H01L 29/66439; H01L 29/775; H01L 21/823475; H01L 21/823871; H01L 21/76895; H01L 21/76897; H01L 21/76807–76813; H01L 21/76816; H01L 21/76877; H01L 21/76879; H01L 21/76883; H01L 23/5226; H01L 23/528; H01L 23/5283; H01L 23/5286; H01L 23/5386; H01L 23/53228–53238; H01L 23/53257–53266; H01L 21/76841–76865; H01L 23/53252; H01L 23/53266; H01L 29/66795–66848; H01L 23/53238; H10B 12/36; H10B 12/056
See application file for complete search history.

(56) References Cited

U.S. PATENT DOCUMENTS

| | | | |
|---|---|---|---|
| 6,979,625 B1 | 12/2005 | Woo et al. | |
| 7,388,289 B1* | 6/2008 | Rhodes | H01L 21/76816 |
| | | | 257/E23.152 |
| 9,530,737 B1* | 12/2016 | Fu | H01L 23/528 |
| 9,721,894 B2 | 8/2017 | Fu et al. | |
| 10,096,544 B2 | 10/2018 | Lai et al. | |
| 10,529,663 B1* | 1/2020 | Nogami | H01L 23/53238 |
| 10,553,593 B2 | 2/2020 | Bae et al. | |
| 2001/0034119 A1* | 10/2001 | Morozumi | H01L 23/53295 |
| | | | 257/E21.585 |
| 2005/0070090 A1* | 3/2005 | Lee | H01L 21/76879 |
| | | | 438/653 |
| 2006/0289999 A1* | 12/2006 | Lee | H01L 21/76883 |
| | | | 257/E21.585 |
| 2012/0018889 A1* | 1/2012 | Vannier | H01L 21/76847 |
| | | | 257/E21.585 |
| 2016/0293484 A1* | 10/2016 | Lee | H01L 23/522 |
| 2017/0133317 A1 | 5/2017 | Kim et al. | |
| 2017/0170062 A1* | 6/2017 | Murray | H01L 21/76879 |
| 2017/0256449 A1 | 9/2017 | Zhang et al. | |
| 2018/0254181 A1 | 9/2018 | Ishizaka | |
| 2018/0358293 A1* | 12/2018 | Hong | H01L 21/76808 |
| 2019/0051600 A1* | 2/2019 | Oh | H01L 21/76832 |
| 2019/0295942 A1* | 9/2019 | Badaroglu | H01L 23/5226 |
| 2019/0378911 A1* | 12/2019 | Lee | H01L 29/78696 |
| 2020/0135558 A1* | 4/2020 | Standaert | H01L 23/5226 |
| 2021/0020569 A1* | 1/2021 | Parikh | H01L 21/76877 |
| 2021/0066289 A1 | 3/2021 | Noh et al. | |
| 2021/0134785 A1 | 5/2021 | Yang et al. | |

FOREIGN PATENT DOCUMENTS

| | | |
|---|---|---|
| KR | 10-2013-0124428 A | 11/2013 |
| KR | 1020180101226 A | 9/2018 |
| KR | 10-2019-0053426 A | 5/2019 |

* cited by examiner

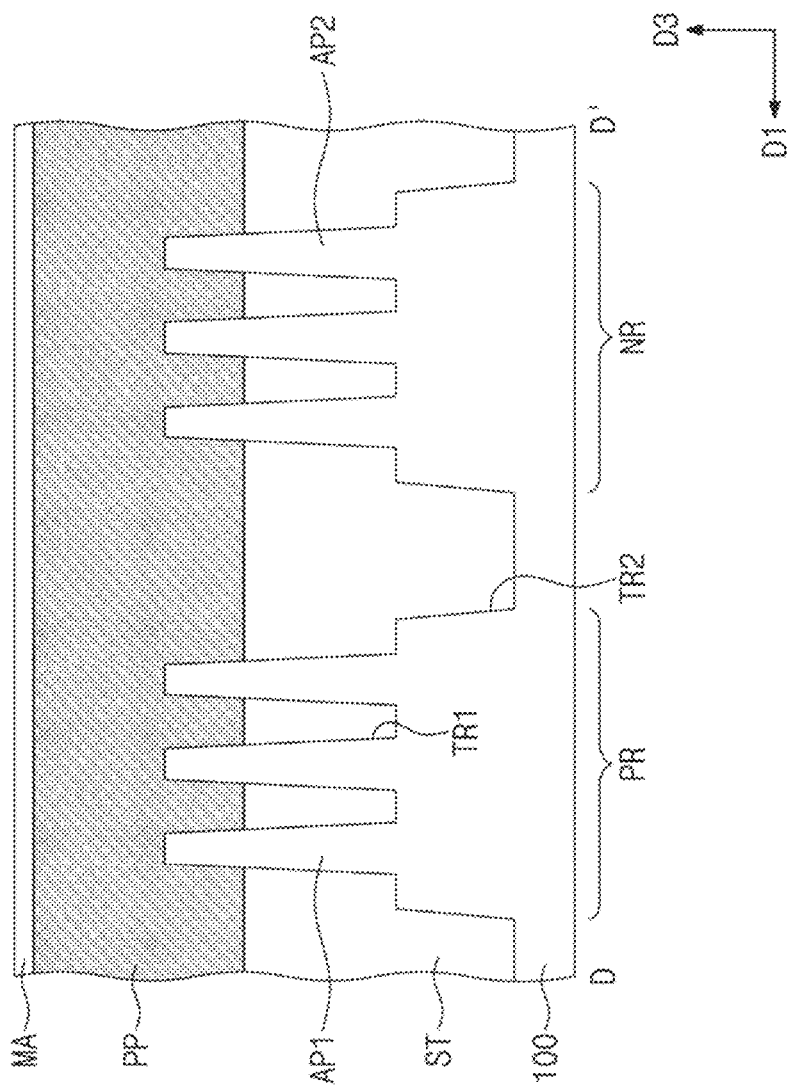

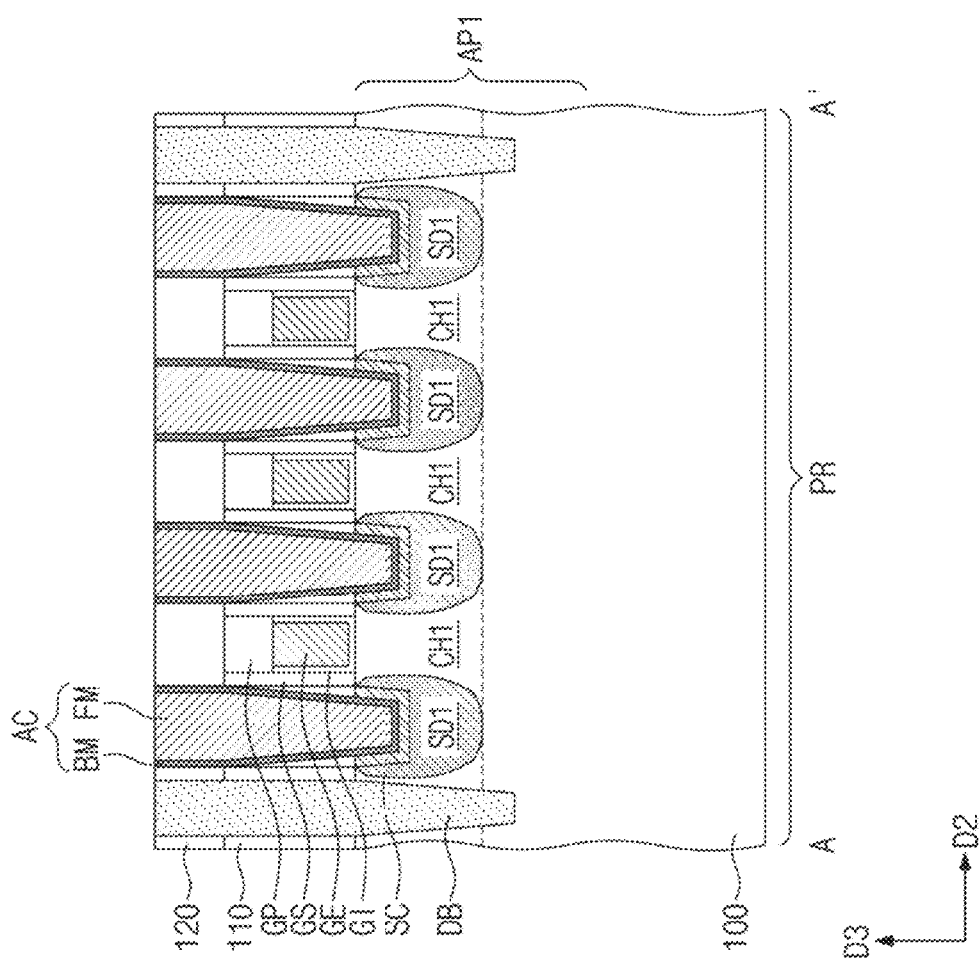

SEMICONDUCTOR DEVICE HAVING INTERCONNECTION LINES WITH DIFFERENT LINEWIDTHS AND METAL PATTERNS

CROSS-REFERENCE TO RELATED APPLICATIONS

This application is a Continuation of U.S. application Ser. No. 16/940,933, filed on Jul. 28, 2020, which claims the benefit of Korean Patent Application No. 10-2019-0167872, filed on Dec. 16, 2019, in the Korean Intellectual Property Office, the entire contents of which are hereby incorporated by reference.

BACKGROUND

The present disclosure relates to a semiconductor device, and in particular, to a semiconductor device including a field effect transistor and a method of fabricating the same.

A semiconductor device includes an integrated circuit including metal-oxide-semiconductor field-effect transistors (MOS-FETs). To meet an increasing demand for a semiconductor device with a smaller pattern size and/or a reduced design rule, MOS-FETs are being scaled down. The scale-down of MOS-FETs may lead to deterioration in operational properties of the semiconductor device. A variety of studies are being conducted to overcome technical limitations associated with the scale-down of the semiconductor device and to realize higher performance semiconductor devices.

SUMMARY

Some example embodiments of the inventive concepts provide a semiconductor device with improved electric characteristics.

According to some example embodiments of the inventive concepts, a semiconductor device may include transistors on a substrate, a first interlayered insulating layer on the transistors, a first lower interconnection line and a second lower interconnection line in an upper portion of the first interlayered insulating layer, and a first via and a second via on the first and second lower interconnection lines, respectively. A linewidth of the first lower interconnection line may be larger than a linewidth of the second lower interconnection line. Each of the first and second lower interconnection lines may include a first metal pattern. The first lower interconnection line may further include a second metal pattern, on the first metal pattern and contain a metallic material different from the first metal pattern, and the second metal pattern may be absent in the second lower interconnection line. The second via may include a first portion in contact with a top surface of the first interlayered insulating layer and a second portion in contact with a top surface of the second lower interconnection line, and the lowest level of a bottom surface of the second portion may be lower than the lowest level of a bottom surface of the first via.

According to some example embodiments of the inventive concepts, a semiconductor device may include transistors on a substrate, a first interlayered insulating layer on the transistors, and a first lower interconnection line and a second lower interconnection line in an upper portion of the first interlayered insulating layer. A linewidth of the first lower interconnection line may be larger than a linewidth of the second lower interconnection line. Each of the first and second lower interconnection lines may include a first metal pattern, and the first lower interconnection line may further include a second metal pattern, which is provided on the first metal pattern and contains a metallic material different from the first metal pattern. The second metal pattern may have the largest volume in the first lower interconnection line, and the first metal pattern may have the largest volume in the second lower interconnection line. The highest level of a top surface of the second lower interconnection line may be lower than the highest level of a top surface of the first lower interconnection line, and a top surface of the second metal pattern of the first lower interconnection line may be higher than a top surface of the first metal pattern of the first lower interconnection line.

According to some example embodiments of the inventive concepts, a semiconductor device may include a substrate including an active region, a device isolation layer on the active region to define active patterns and to cover a lower portion of a side surface of each of the active patterns, an upper portion of each of the active patterns protruding above the device isolation layer, a pair of source/drain patterns in the upper portion of each of the active patterns, a channel pattern between the pair of source/drain patterns, a gate electrode crossing the channel pattern and extending in a first direction, a gate spacer at both sides of the gate electrode and extended in the first direction, along with the gate electrode, a gate dielectric pattern between the gate electrode and the channel pattern and between the gate electrode and the gate spacer, a gate capping pattern on a top surface of the gate electrode and extended in the first direction, along with the gate electrode, a first interlayered insulating layer on the gate capping pattern, an active contact, to penetrate the first interlayered insulating layer and to be electrically connected to at least one of the source/drain patterns, a first metal layer provided in a second interlayered insulating layer on the first interlayered insulating layer, and a second metal layer in a third interlayered insulating layer on the second interlayered insulating layer. The first metal layer may include a first lower interconnection line and a second lower interconnection line, which are extended in a second direction crossing the first direction, and at least one of which is electrically connected to the active contact. The second metal layer may include first and second upper interconnection lines, which is electrically connected to the first and second lower interconnection lines, respectively, through first and second vias. A linewidth of the first lower interconnection line may be larger than a linewidth of the second lower interconnection line. Each of the first and second lower interconnection lines may include a first metal pattern, and the first lower interconnection line may further include a second metal pattern, which is provided on the first metal pattern and contains a metallic material different from the first metal pattern. The second metal pattern may be absent in the second lower interconnection line. The second via may include a first portion in contact with a top surface of the second interlayered insulating layer and a second portion in contact with a top surface of the second lower interconnection line. The lowest level of a bottom surface of the second portion may be lower than the lowest level of a bottom surface of the first via.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6, 8A, 10A, and 12A are sectional views taken along lines A-A' of FIGS. 5, 7, 9, and 11, respectively.

FIGS. 10D and 12D are sectional views taken along lines D-D' of FIGS. 9 and 11, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
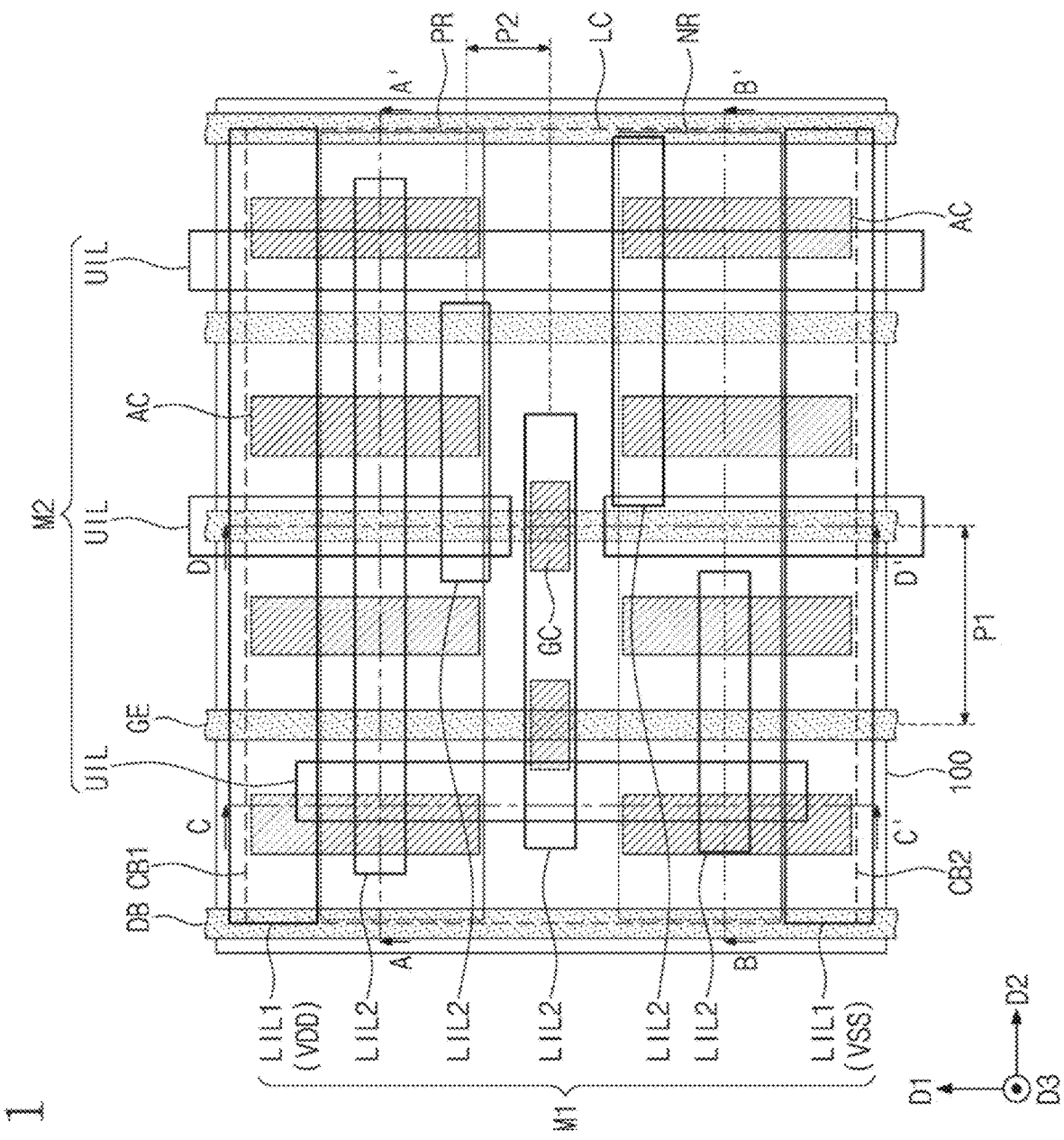
FIG. 1 is a plan view illustrating a semiconductor device according to some example embodiments of the inventive concepts.

FIG. 1 is a plan view illustrating a semiconductor device according to some example embodiments of the inventive concepts. FIGS. 2A to 2D are sectional views taken along lines A-A', B-B', C-C', and D-D', respectively, of FIG. 1. FIG. 3 is an enlarged sectional view illustrating portions M and N of FIG. 2D.

Referring to FIGS. 1 and 2A to 2D, a logic cell LC may be provided on a substrate 100. In the present specification, the logic cell LC may mean a logic device (e.g., an inverter, a flip-flop, and so forth), which is configured to execute a specific function. For example, the logic cell LC may include transistors constituting the logic device and interconnection lines connecting the transistors to each other.

The substrate 100 may include a first active region PR and a second active region NR. In some example embodiments, the first active region PR may be a PMOSFET region, and the second active region NR may be an NMOSFET region. The substrate 100 may be a semiconductor substrate (e.g., of silicon, germanium, or silicon-germanium) or a compound semiconductor substrate. For example, the substrate 100 may be a silicon wafer.

The first and second active regions PR and NR may be defined by a second trench TR2, which is formed in an upper portion of the substrate 100. The second trench TR2 may be positioned between the first and second active regions PR and NR. The first and second active regions PR and NR may be spaced apart from each other, in a first direction D1, with the second trench TR2 interposed therebetween. Each of the first and second active regions PR and NR may be extended in a second direction D2 that is different from the first direction D1.

First active patterns AP1 and second active patterns AP2 may be provided on the first active region PR and the second active region NR, respectively. The first and second active patterns AP1 and AP2 may extend in the second direction D2 and may be parallel to each other. The first and second active patterns AP1 and AP2 may be portions of the substrate 100 protruding in a vertical direction (e.g., a third direction D3). A first trench TR1 may be defined between adjacent ones of the first active patterns AP1 and between adjacent ones of the second active patterns AP2. The first trench TR1 may be shallower than the second trench TR2.

A device isolation layer ST may fill the first and second trenches TR1 and TR2. The device isolation layer ST may be formed of or include silicon oxide. The upper portions of the first and second active patterns AP1 and AP2 may be protruding patterns, which are vertically extended above the device isolation layer ST (e.g., see FIG. 2D). Each of the upper portions of the first and second active patterns AP1 and AP2 may be shaped like a fin. The device isolation layer ST may not cover the upper portions of the first and second active patterns AP1 and AP2. The device isolation layer ST may cover lower portions of side surfaces of the first and second active patterns AP1 and AP2.

First source/drain patterns SD1 may be provided in the upper portions of the first active patterns AP1. The first source/drain patterns SD1 may be impurity regions of a first conductivity type (e.g., p-type). A first channel pattern CH1 may be interposed between a pair of the first source/drain patterns SD1. Second source/drain patterns SD2 may be provided in the upper portions of the second active patterns AP2. The second source/drain patterns SD2 may be impurity regions of a second conductivity type (e.g., n-type). A second channel pattern CH2 may be interposed between a pair of the second source/drain patterns SD2.

The first and second source/drain patterns SD1 and SD2 may be epitaxial patterns, which are formed by a selective epitaxial growth process. As an example, the first and second source/drain patterns SD1 and SD2 may have top surfaces that are coplanar with top surfaces of the first and second channel patterns CH1 and CH2. As another example, the top surfaces of the first and second source/drain patterns SD1 and SD2 may be higher than the top surfaces of the first and second channel patterns CH1 and CH2.

The first source/drain patterns SD1 may include a semiconductor element (e.g., SiGe), whose lattice constant is larger than a lattice constant of a semiconductor element in the substrate 100. Accordingly, the first source/drain patterns SD1 may exert a compressive stress on the first channel patterns CH1. As an example, the second source/drain patterns SD2 may include the semiconductor element (e.g., Si) as the substrate 100.

Gate electrodes GE may be provided to cross the first and second active patterns AP1 and AP2 and extend in the first direction D1. The gate electrodes GE may be arranged to be spaced apart from each other with a first pitch P1 in the second direction D2. The gate electrodes GE may be overlapped with the first and second channel patterns CH1 and CH2 when viewed in a plan view. Each of the gate electrodes GE may enclose a top surface and opposite side surfaces of each of the first and second channel patterns CH1 and CH2.

Referring back to FIG. 2D, the gate electrode GE may be provided on a first top surface TS1 of the first channel pattern CH1 and on at least one first side surface SW1 of the first channel pattern CH1. The gate electrode GE may be provided on a second top surface TS2 of the second channel pattern CH2 and on at least one second side surface SW2 of the second channel pattern CH2. For example, the transistor according to the some example embodiments may be a three-dimensional field effect transistor (e.g., FinFET), in which the gate electrode GE is disposed to three-dimensionally surround the channel patterns CH1 and CH2.

Referring back to FIGS. 1 and 2A to 2D, a pair of gate spacers GS may be disposed on opposite side surfaces of each of the gate electrodes GE. The gate spacers GS may extend along the gate electrodes GE and in the first direction D1. Top surfaces of the gate spacers GS may be higher than top surfaces of the gate electrodes GE. The top surfaces of the gate spacers GS may be coplanar with a top surface of a first interlayered insulating layer 110, which will be described below. The gate spacers GS may be formed of or include at least one of SiCN, SiCON, or SiN. In some example embodiments, the gate spacers GS may be a multi-layered structure, which includes at least two different materials selected from SiCN, SiCON, and SiN.

A gate capping pattern GP may be provided on each of the gate electrodes GE. The gate capping pattern GP may extend along the gate electrode GE and in the first direction D1. The gate capping pattern GP may be formed of or include at least one of materials, which have etch selectivity with respect to first and second interlayered insulating layers 110 and 120 to be described below. For example, the gate capping patterns GP may be formed of or include at least one of SiON, SiCN, SiCON, or SiN.

A gate dielectric pattern GI may be interposed between the gate electrode GE and the first active pattern AP1 and between the gate electrode GE and the second active pattern AP2. The gate dielectric pattern GI may extend along a bottom surface of the gate electrode GE thereon. As an example, the gate dielectric pattern GI may cover the first top surface TS1 and the first side surfaces SW1 of the first channel pattern CH1. The gate dielectric pattern GI may cover the second top surface TS2 and both of the second side surfaces SW2 of the second channel pattern CH2. The gate dielectric pattern GI may cover a top surface of the device isolation layer ST below the gate electrode GE (e.g., see FIG. 12E).

In some example embodiments, the gate dielectric pattern GI may be formed of or include a high-k dielectric material, whose dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrode GE may include a first metal and a second metal on the first metal. The first metal may be provided on the gate dielectric pattern GI and may be adjacent to the first and second channel patterns CH1 and CH2. The first metal may include a work function metal adjusting a threshold voltage of a transistor. By adjusting a thickness and composition of the first metal, it may be possible to realize a transistor having a desired threshold voltage.

The first metal may include a metal nitride layer. For example, the first metal may include at least one metal, which is selected from the group consisting of titanium (Ti), tantalum (Ta), aluminum (Al), tungsten (W) and molybdenum (Mo), and nitrogen (N). In some example embodiments, the first metal may further include carbon (C). The first metal may include a plurality of work function metal layers, which are stacked.

The second metal may include a metal having electric resistance lower than the first metal. For example, the second metal may include at least one metal selected from the group consisting of tungsten (W), aluminum (Al), titanium (Ti), and tantalum (Ta).

A first interlayered insulating layer 110 may be provided on the substrate 100. The first interlayered insulating layer 110 may cover the gate spacers GS and the first and second source/drain patterns SD1 and SD2. A top surface of the first interlayered insulating layer 110 may be substantially coplanar with top surfaces of the gate capping patterns GP and the top surfaces of the gate spacers GS. A second interlayered insulating layer 120 may be provided on the first interlayered insulating layer 110 to cover the gate capping patterns GP. A third interlayered insulating layer 130 may be provided on the second interlayered insulating layer 120. A fourth interlayered insulating layer 140 may be provided on the third interlayered insulating layer 130. In some example embodiments, the first to fourth interlayered insulating layers 110-140 may be formed of or include silicon oxide.

A pair of isolation structures DB may be provided at both sides of the logic cell LC, which are opposite to each other in the second direction D2. The isolation structure DB may be extended in the first direction D1 and parallel to the gate electrodes GE. In some example embodiments, a pitch between the isolation structure DB and the gate electrode GE adjacent to each other may be equal to the first pitch P1.

The isolation structure DB may be provided to penetrate the first and second interlayered insulating layers 110 and 120 and may be extended into the first and second active patterns AP1 and AP2. The isolation structure DB may penetrate the upper portion of each of the first and second active patterns AP1 and AP2. The isolation structure DB may separate the first and second active regions PR and NR of the logic cell LC from the active region of a neighboring logic cell.

Active contacts AC may be provided to penetrate the first and second interlayered insulating layers 110 and 120 and may be electrically connected to the first and second source/drain patterns SD1 and SD2, respectively. Each of the active contacts AC may be provided between a pair of the gate electrodes GE.

The active contact AC may be a self-aligned contact. For example, the active contact AC may be formed by a self-alignment process using the gate capping pattern GP and the gate spacer GS. For example, the active contact AC may cover at least a portion of a side surface of the gate spacer GS. Although not shown, in some example embodiments, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected to the source/drain pattern SD1 or SD2 through the silicide pattern SC. The silicide pattern SC may be formed of or include at least one of metal-silicide materials (e.g., titanium silicide, tantalum silicide, tungsten silicide, nickel silicide, and cobalt-silicide).

A gate contact GC may be provided to penetrate the second interlayered insulating layer 120 and the gate capping pattern GP and to be connected to the gate electrode GE. When viewed in a plan view, the gate contact GC may be provided between the first and second active regions PR and NR. A bottom surface of the gate contact GC may be in contact with the top surface of the gate electrode GE. The gate contact GC may have a top surface that is coplanar with a top surface of the second interlayered insulating layer 120.

Each of the active and gate contacts AC and GC may include a conductive pattern FM and a barrier pattern BM enclosing the conductive pattern FM. For example, the conductive pattern FM may be formed of or include at least one metal of aluminum, copper, tungsten, molybdenum, or cobalt. The barrier pattern BM may cover side and bottom surfaces of the conductive pattern FM. The barrier pattern BM may include at least one of a metal layer or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A first metal layer M1 may be provided in the third interlayered insulating layer 130. The first metal layer M1 may include first lower interconnection lines LIL1, second lower interconnection lines LIL2, and lower vias VI. The lower vias VI may be provided below the first and second lower interconnection lines LIL1 and LIL2.

The first lower interconnection lines LIL1 may be provided to extend in the second direction D2 and to cross the logic cell LC. The first lower interconnection lines LIL1 may serve as power lines. For example, a drain voltage VDD or a source voltage VSS may be applied to the first lower interconnection line LIL1.

Referring to FIG. 1, a first cell boundary CB1 extending in the second direction D2 may be defined in a region of the logic cell LC. A second cell boundary CB2 extending in the second direction D2 may be defined in a region of the logic cell LC opposite to the first cell boundary CB1. The first lower interconnection line LIL1, to which the drain voltage VDD (e.g., a power voltage) is applied, may be disposed on the first cell boundary CB1. The first lower interconnection line LIL1, to which the drain voltage VDD is applied, may extend along the first cell boundary CB1 or in the second direction D2. The first lower interconnection line LIL1, to which the source voltage VSS (e.g., a ground voltage) is applied, may be disposed on the second cell boundary CB2. The first lower interconnection line LIL1, to which the source voltage VSS is applied, may extend along the second cell boundary CB2 or in the second direction D2.

The second lower interconnection lines LIL2 may be disposed between the first lower interconnection line LIL1 and the first lower interconnection line LIL1, which are respectively applied with the drain voltage VDD and the source voltage VSS. The second lower interconnection lines LIL2 may extend in the second direction D2 and may be parallel to each other. When viewed in a plan view, the second lower interconnection lines LIL2 may be line or bare-shaped patterns. The second lower interconnection lines LIL2 may be arranged to be spaced apart from each other with a second pitch P2 in the first direction D1. The second pitch P2 may be smaller than the first pitch P1.

A linewidth of each of the first lower interconnection lines LIL1 may be a first width W1. A linewidth of each of the second lower interconnection lines LIL2 may be a second width W2. The second width W2 may be smaller than the first width W1. For example, the first width W1 may be smaller than 12 nm. The second width W2 may be larger than 12 nm.

The lower vias VI may be interposed between the first and second lower interconnection lines LIL1 and LIL2 and the active contacts AC. The lower vias VI may be interposed between the second lower interconnection lines LIL2 and the gate contacts GC.

An etch stop layer ESL may be interposed between the third and fourth interlayered insulating layers 130 and 140. A second metal layer M2 may be provided in the fourth interlayered insulating layer 140. The second metal layer M2 may include upper interconnection lines UIL.

The upper interconnection lines UIL may extend in the first direction D1 and may be parallel to each other. When viewed in a plan view, the upper interconnection lines UIL may be line or bare-shaped patterns. The upper interconnection lines UIL may be arranged in the second direction D2.

The upper interconnection line UIL may include a line portion HEP and a via portion VEP. The line portion HEP may be provided in an upper portion of the fourth interlayered insulating layer 140 and may be extended in the first direction D1. The via portion VEP may be provided in a lower portion of the fourth interlayered insulating layer 140 and may be extended from the line portion HEP toward the first metal layer M1. For example, the via portion VEP may be a via plug, which is interposed between the first metal layer M1 and the line portion HEP to connect them to each other.

The line and via portions HEP and VEP may be connected to each other to constitute a single conductive element (for example, serving as the upper interconnection line UIL). In some example embodiments, the line and via portions HEP and VEP constituting the upper interconnection line UIL may be formed by a dual damascene process.

The first lower interconnection line LIL1 and the second lower interconnection line LIL2 according to some example embodiments will be described in more detail with reference to FIG. 3.

First, the first lower interconnection line LIL1 will be described in more detail. The first lower interconnection line LIL1 may include a barrier metal pattern BAP, a first metal pattern MEP1 on the barrier metal pattern BAP, a second metal pattern MEP2 on the first metal pattern MEP1, and a metal capping pattern CAP on the second metal pattern MEP2.

An upper portion of the barrier metal pattern BAP may be recessed to define a recess region RS. In some example embodiments, a top surface BAPt of the barrier metal pattern BAP may be lower than a top surface 130t of the third interlayered insulating layer 130. The barrier metal pattern BAP may have a 'U'-shaped section.

The barrier metal pattern BAP may improve an adhesion property between the first lower interconnection line LIL1 and the third interlayered insulating layer 130. The barrier metal pattern BAP may serve as a barrier reducing or preventing metallic elements in the second metal pattern MEP2 from being diffused into the third interlayered insulating layer 130. The barrier metal pattern BAP may be formed of or include at least one of tantalum nitride (TaN), titanium nitride (TiN), tantalum oxide (TaO), titanium oxide (TiO), manganese nitride (MnN), and manganese oxide (MnO).

The first metal pattern MEP1 may include a lower portion LP and a pair of upper portions UP, which are extended from the lower portion LP in the third direction D3. For example, the first metal pattern MEP1 may have a 'U'-shaped section. The top surface 130t of the third interlayered insulating layer 130 may be positioned at a first level LV1. A top surface MEP1t of the upper portion UP of the first metal pattern MEP1 may be positioned at a second level LV2. The second level LV2 may be lower than the first level LV1. The upper portion UP of the first metal pattern MEP1 may have a first thickness T1 in the first direction D1.

The first metal pattern MEP1 may be formed of or include a metallic material (e.g., ruthenium (Ru), cobalt (Co), tungsten (W), or molybdenum (Mo)) having a relatively short electron mean free path (eMFP), and the eMFP will be described below. The first metal pattern MEP1 may have a low resistivity property, when it has a relatively small thickness (e.g., the first thickness T1 of 12 nm or smaller).

The second metal pattern MEP2 may be provided in a space, which is enclosed by the lower portion LP and the pair of the upper portions UP of the first metal pattern MEP1. In other words, a bottom surface of the second metal pattern MEP2 may be in contact with the lower portion LP of the first metal pattern MEP1. Both side surfaces of the second metal pattern MEP2 may be in contact with the pair of the upper portions UP of the first metal pattern MEP1, respectively. The second metal pattern MEP2 may have the largest volume, among the metal patterns constituting the first lower interconnection line LIU.

The second metal pattern MEP2 may have a curved top surface MEP2t. The highest level of the top surface MEP2t of the second metal pattern MEP2 may be positioned at a third level LV3. The third level LV3 may be positioned between the first level LV1 and the second level LV2.

The second metal pattern MEP2 may be formed of or include a metallic material different from the first metal pattern MEP1. The second metal pattern MEP2 may be formed of or include a metallic material (e.g., copper (Cu)) having a relatively long eMFP. The second metal pattern MEP2 may have a low resistivity property, when it has a relatively large linewidth.

The metal capping pattern CAP may cover the top surface MEP1t of the first metal pattern MEP1 and the top surface MEP2t of the second metal pattern MEP2. The metal capping pattern CAP may be provided to have a thin and uniform thickness. The metal capping pattern CAP may be formed of or include at least one of ruthenium (Ru), cobalt (Co), or graphene.

A highest level of a top surface LIL1t of the first lower interconnection line LIL1 may be positioned at a fourth level LV4. In some example embodiments, the fourth level LV4 may be the same or substantially the same as the first level LV1. In some example embodiments, the fourth level LV4 may be positioned between the first level LV1 and the third level LV3.

Next, the second lower interconnection line LIL2 will be described in more detail. The second lower interconnection line LIL2 may include the barrier metal pattern BAP, the first metal pattern MEP1 on the barrier metal pattern BAP, and the metal capping pattern CAP on the first metal pattern MEP1. The second metal pattern MEP2 may be omitted from the second lower interconnection line LIL2, unlike the first lower interconnection line LIL1.

The barrier metal pattern BAP of the second lower interconnection line LIL2 may be formed of or include the same material as the barrier metal pattern BAP of the first lower interconnection line LIL1. The first metal pattern MEP1 of the second lower interconnection line LIL2 may be formed of or include the same material as the first metal pattern MEP1 of the first lower interconnection line LIL1. The metal capping pattern CAP of the second lower interconnection line LIL2 may be formed of or include the same material as the metal capping pattern CAP of the first lower interconnection line LIL1.

The first metal pattern MEP1 of the second lower interconnection line LIL2 may have a second thickness T2 in the first direction D1. The second thickness T2 may be larger than two times the first thickness T1. In some example embodiments, the second thickness T2 may be smaller than 12 nm.

The top surface MEP1t of the first metal pattern MEP1 of the second lower interconnection line LIL2 may have a curved shape. The highest level of the top surface MEP1t of the first metal pattern MEP1 may be positioned at the second level LV2. The second level LV2 may be lower than the first level LV1. The metal capping pattern CAP of the second lower interconnection line LIL2 may cover the top surface MEP1t of the first metal pattern MEP1.

The highest level of a top surface LIL2t of the second lower interconnection line LIL2 may be positioned at a fifth level LV5. The fifth level LV5 may be lower than the fourth level LV4 of the top surface LIL1t of the first lower interconnection line LIL1. The fifth level LV5 may be positioned between the first level LV1 and the second level LV2.

The etch stop layer ESL may cover the top surface LIL1t of the first lower interconnection line LIL1, the top surface LIL2t of the second lower interconnection line LIL2, and the top surface 130t of the third interlayered insulating layer 130. The etch stop layer ESL may fill the recess region RS on the barrier metal pattern BAP.

The via portion VEP of the upper interconnection line UIL may penetrate the etch stop layer ESL and may be in contact with the top surface LIL1t of the first lower interconnection line LIL1. Since the first lower interconnection line LIL1 has a relatively large linewidth, the via portion VEP may be aligned to the first lower interconnection line LIL1, without misalignment. In some example embodiments, the via portion VEP of the upper interconnection line UIL may be aligned to a center of the first lower interconnection line LIL1. The via portion VEP may have a bottom surface which is curved along the top surface LIL1t of the first lower interconnection line LIL1. The lowest level of a bottom surface of the via portion VEP on the first lower interconnection line LIL1 may be positioned at a sixth level LV6.

The via portion VEP of the upper interconnection line UIL may penetrate the etch stop layer ESL and may be in contact with the top surface LIL2t of the second lower interconnection line LIL2. In some example embodiments, the via portion VEP of the upper interconnection line UIL may be offset from a center of the second lower interconnection line LIL2 in the first direction D1. Accordingly, the via portion VEP may include a first portion PA1 in contact with the top surface 130t of the third interlayered insulating layer 130 and a second portion PA2 in contact with the top surface LIL2t of the second lower interconnection line LIL2.

The second portion PA2 may protrude toward the second lower interconnection line LIL2 or in a downward direction, compared with the first portion PA1. Thus, the first portion PA1 and the second portion PA2 may form a staircase structure. A bottom surface of the first portion PA1 may be higher than a bottom surface of the second portion PA2.

The bottom surface of the second portion PA2 of the via portion VEP may have a profile that is curved along the top surface LIL2t of the second lower interconnection line LIL2. The lowest level of the bottom surface of the second portion PA2 of the via portion VEP may be positioned at a seventh level LV7. The seventh level LV7 may be lower than the sixth level LV6.

In some example embodiments where via patterns are formed on the second lower interconnection lines LIL2, whose linewidth and pitch are relatively small, in an offset manner, a short circuit may be formed between adjacent ones of the second lower interconnection lines LIL2. This may lead to failure of a semiconductor device. Referring back to FIG. 2D, the second lower interconnection line LIL2 may be formed to have a top surface lower than the top surface of the third interlayered insulating layer 130. Accordingly, even when the via portion VEP on the second lower interconnection line LIL2 is offset in the first direction D1, the via portion VEP may not be in contact with others of the second lower interconnection lines LIL2 adjacent thereto. That is, it may be possible to reduce or prevent a short circuit from being formed between adjacent ones of the second lower interconnection lines LIL2, even when the via portions VEP are formed in the offset manner.

Figure 4:
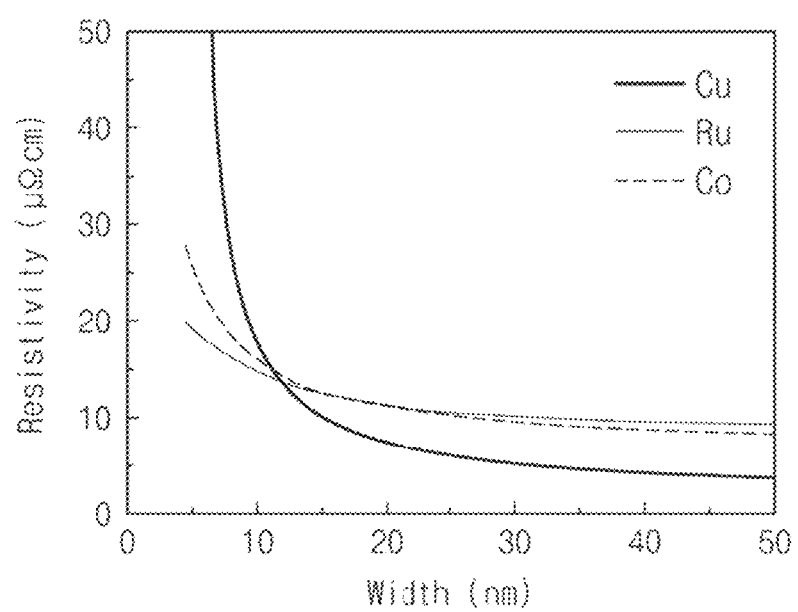
FIG. 4 is a graph showing resistivity of a metal, which is used for a lower interconnection line according to some example embodiments of the inventive concepts.

FIG. 4 is a graph showing resistivity of a metal, which is used for a lower interconnection line according to some example embodiments of the inventive concepts. In detail, FIG. 4 shows a variation in resistivity of metal according to a linewidth of a lower interconnection line.

As shown in FIG. 4, resistivity of an interconnection line may vary depending on a kind of metallic material constituting the interconnection line and a linewidth of the interconnection line. When the interconnection line has a linewidth of several tens nanometers or less, the resistivity of the interconnection line may increase as the linewidth decreases. Such an increase of the resistivity caused by the reduction in linewidth of the interconnection line may be nonlinear.

In some example embodiments where the linewidth of the interconnection line is decreased below a specific value, a resistivity inversion phenomenon may occur between metallic materials whose eMFPs are different from each other. Concretely, the resistivity increase caused by the reduction of the linewidth may be smaller in ruthenium (Ru) and cobalt (Co) having the eMFP value of 12 nm or less than in copper (Cu) having the eMFP value of 12 nm or more. For example, when a line has a linewidth of about 12 nm or less, a ruthenium- or cobalt-containing line may have resistivity lower than a copper-containing line. The eMFP values of copper, cobalt, and ruthenium may be 39 nm, 11.8 nm, and 6.6 nm, respectively, at room temperature and atmospheric pressure.

By contrast, at a relatively large linewidth, the copper may have resistivity lower than the ruthenium and the cobalt. For example, when a line has a linewidth of about 20 nm, a copper-containing line may have resistivity lower than a ruthenium- or cobalt-containing line.

In some example embodiments, referring to FIGS. 3 and 4, the second metal pattern MEP2, which is formed of a metal (e.g., copper (Cu)) having a relatively large eMFP value, may have the largest volume, in the first lower interconnection line LIL1 having a relatively large linewidth.

The first metal pattern MEP1, which is formed of a metal (e.g., ruthenium or cobalt) having a relatively small eMFP value, may have the largest volume, in the second lower interconnection line LIL2 having a relatively small linewidth.

According to some example embodiments of the inventive concepts, metallic materials for the interconnection lines may be selected to optimize or reduce resistivity characteristics of the interconnection lines, in consideration of linewidths of the interconnection lines and the nonlinearity of resistivity. Accordingly, it may be possible to improve an operation speed and/or electric characteristics of the semiconductor device.

Figure 10A:
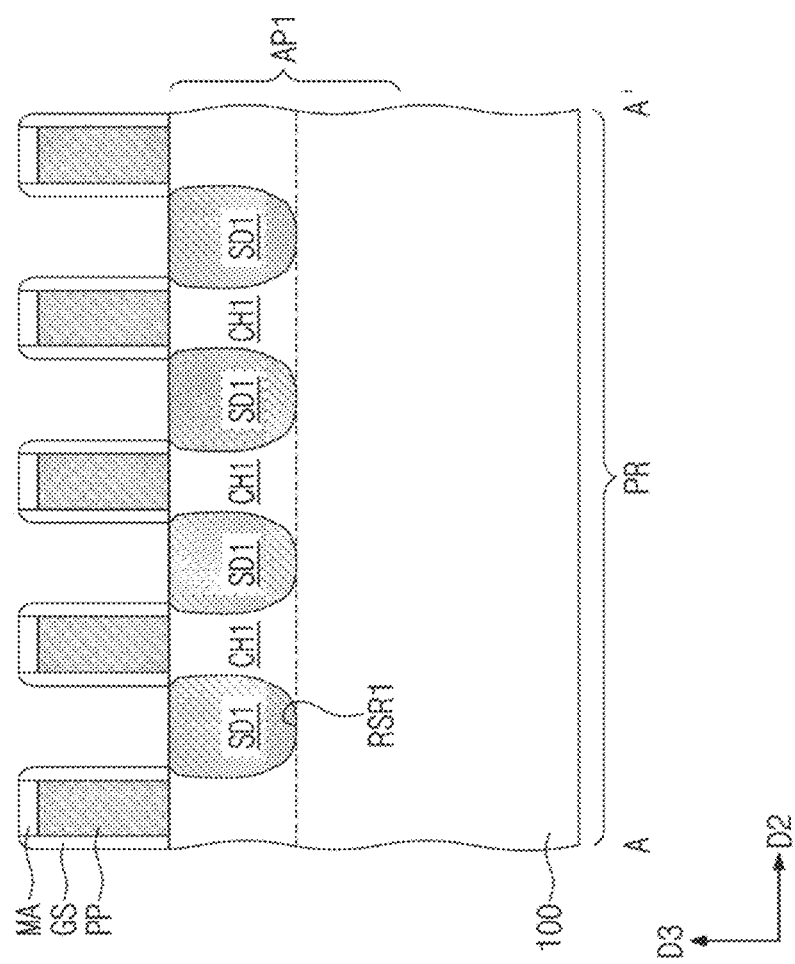
Figure 10B:
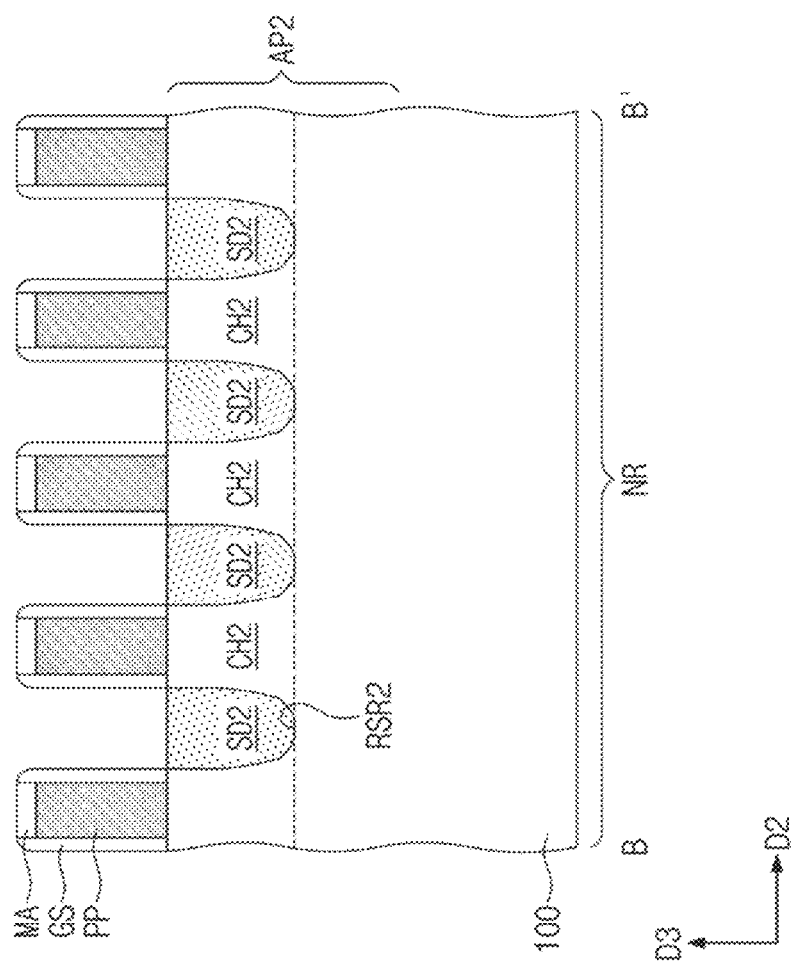
Figure 10C:
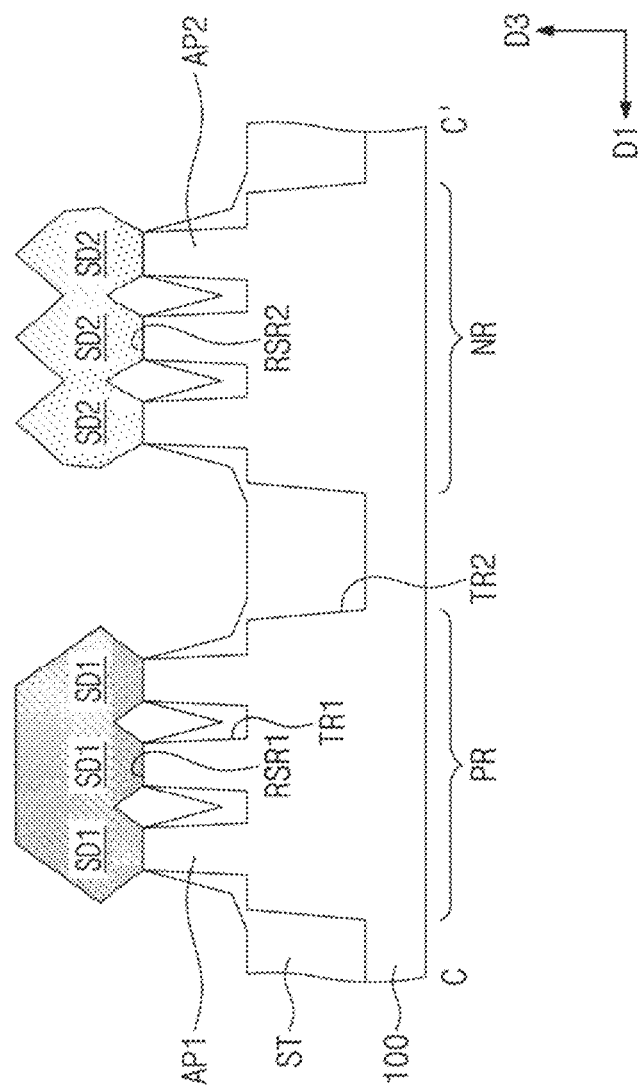
FIGS. 10C and 12C are sectional views taken along lines C-C' of FIGS. 9 and 11, respectively.
Figure 11:
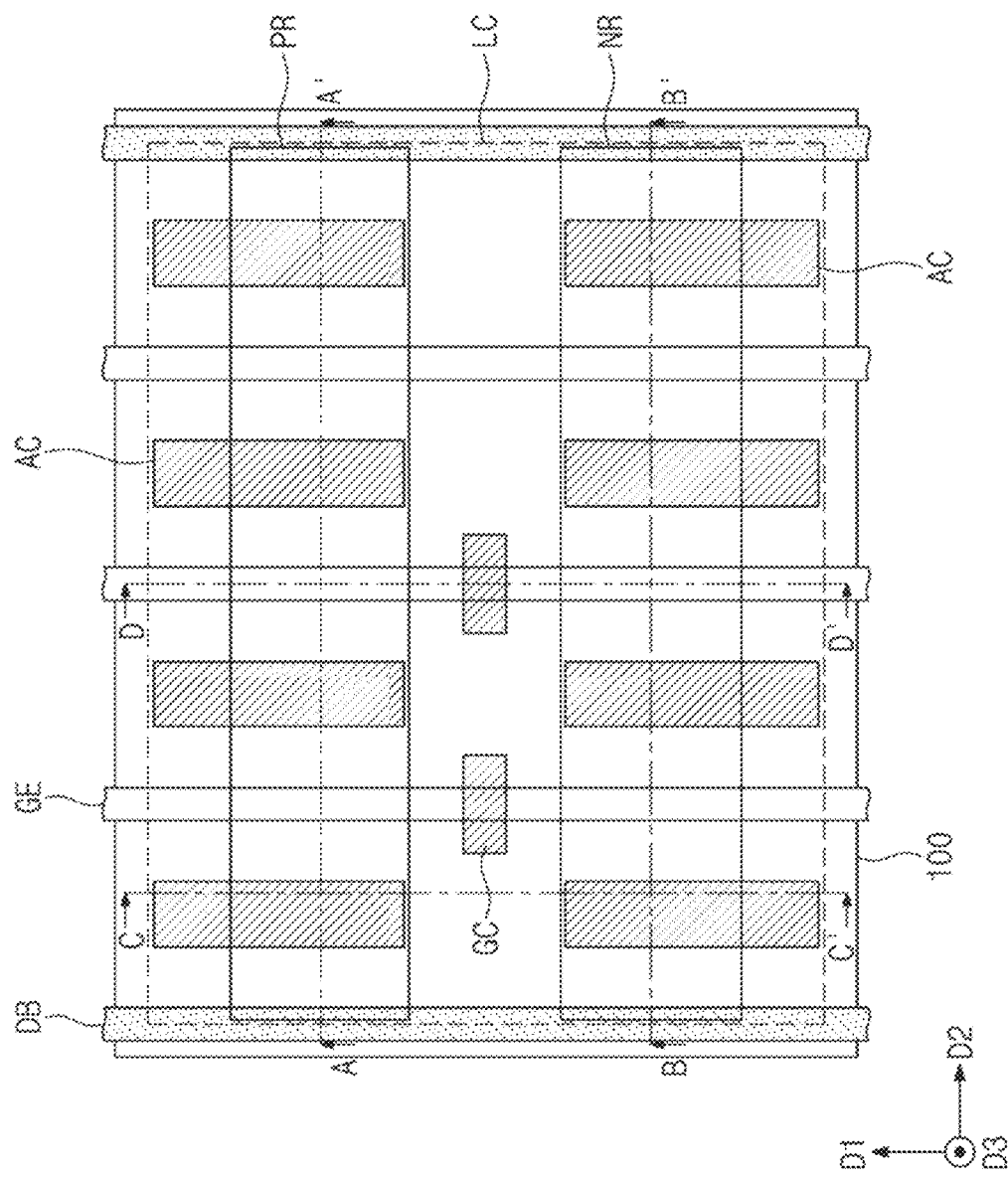
Figure 12B:
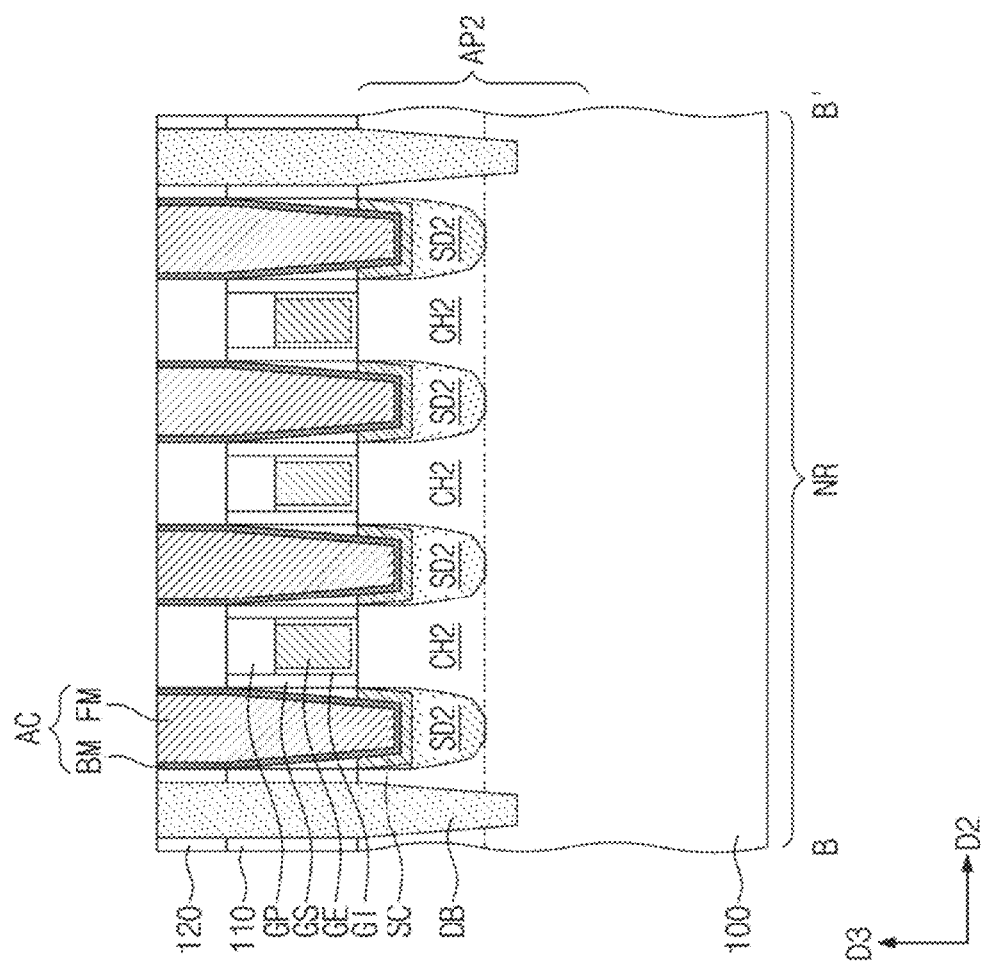
Figure 12C:
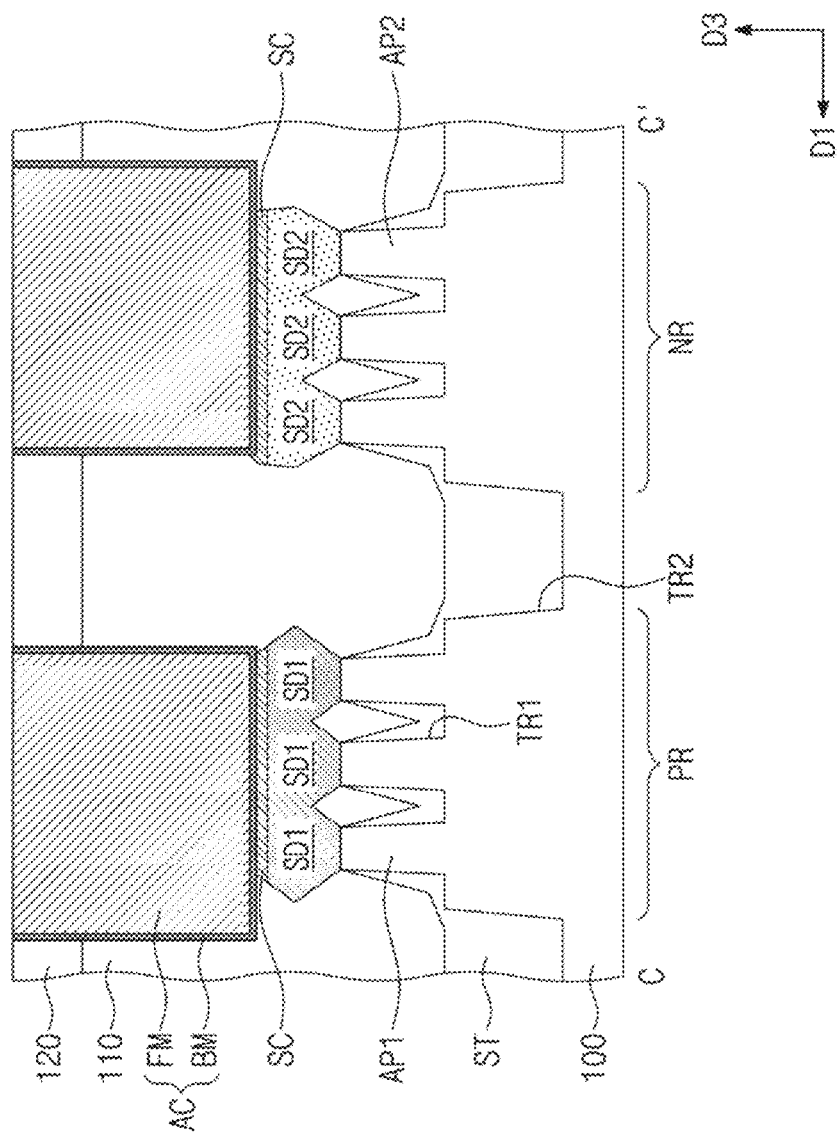
Figure 12D:
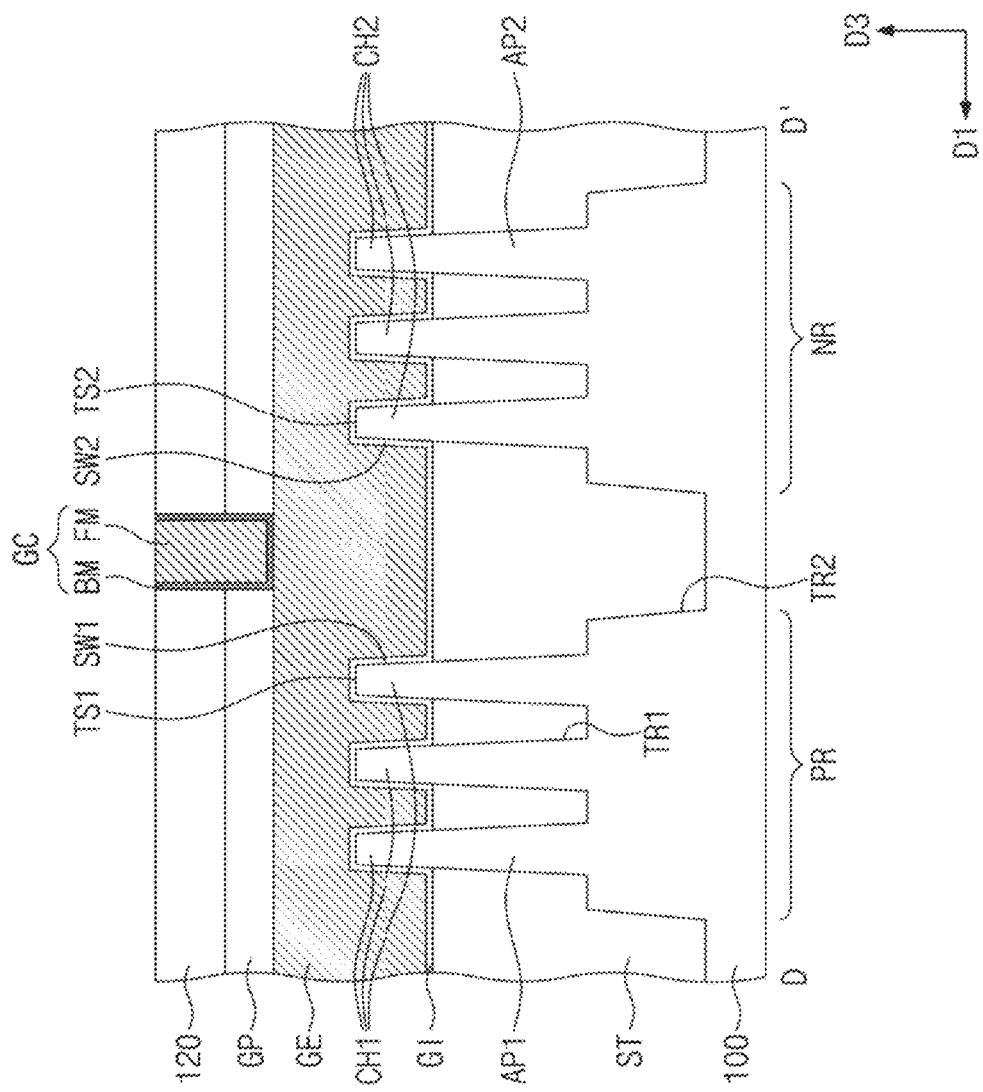

FIGS. 5, 7, 9, and 11 are plan views illustrating a method of fabricating a semiconductor device, according to some example embodiments of the inventive concepts. FIGS. 6, 8A, 10A, and 12A are sectional views taken along lines A-A' of FIGS. 5, 7, 9, and 11, respectively. FIGS. 8B, 10B, and 12B are sectional views taken along lines B-B' of FIGS. 7, 9, and 11, respectively. FIGS. 10C and 12C are sectional views taken along lines C-C' of FIGS. 9 and 11, respectively. FIGS. 10D and 12D are sectional views taken along lines D-D' of FIGS. 9 and 11, respectively.

Figure 5:
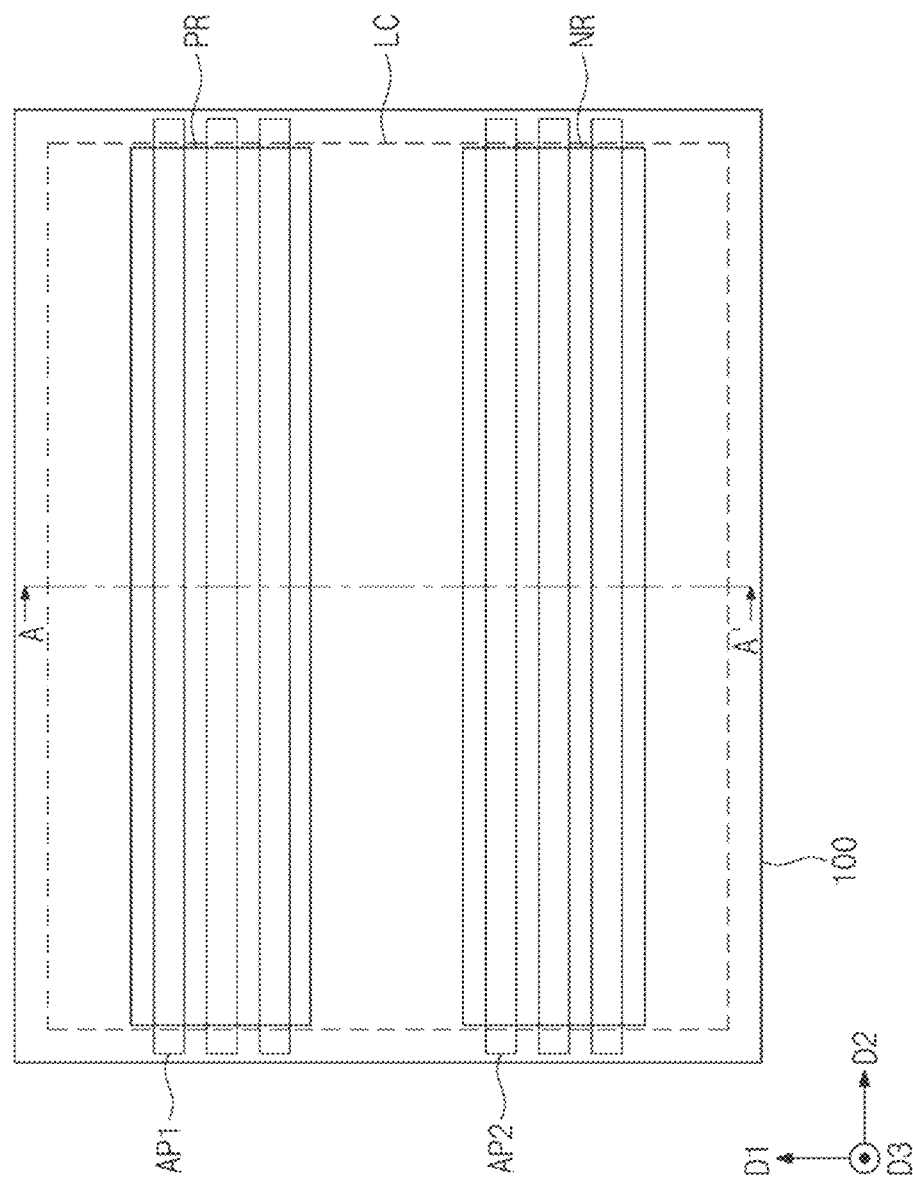
FIGS. 5, 7, 9, and 11 are plan views illustrating a method of fabricating a semiconductor device, according to some example embodiments of the inventive concepts.
Figure 6:
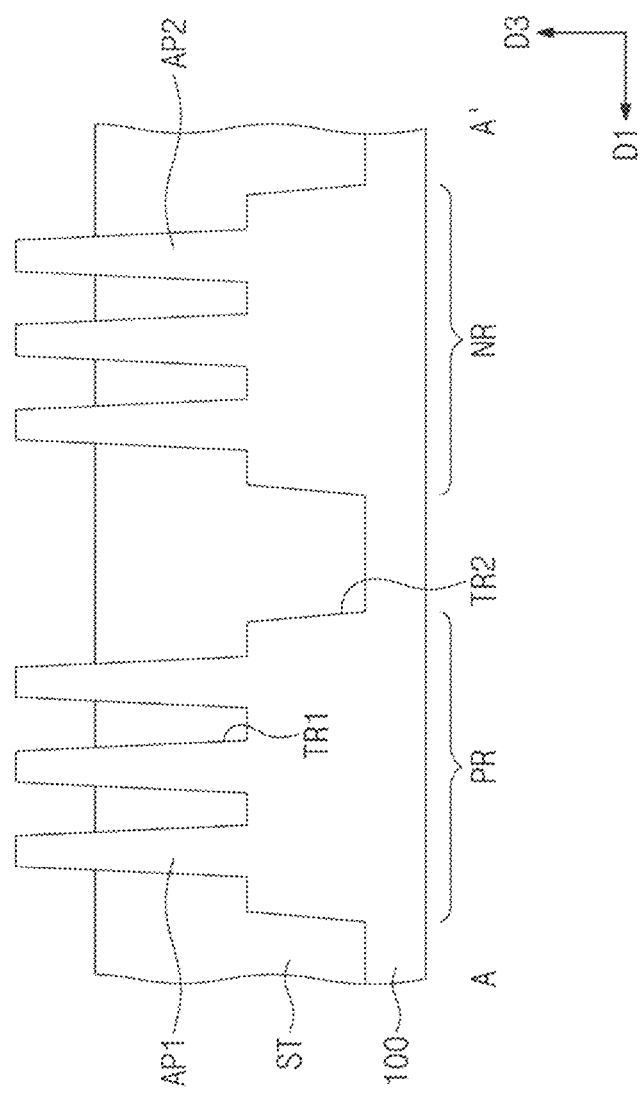

Referring to FIGS. 5 and 6, the substrate 100 including the first and second active regions PR and NR may be provided. The first and second active regions PR and NR may define the logic cell LC on the substrate 100.

The first and second active patterns AP1 and AP2 may be formed by patterning the substrate 100. The first active patterns AP1 may be formed on the first active region PR, and the second active patterns AP2 may be formed on the second active region NR. The first trench TR1 may be formed between the first active patterns AP1 and between the second active patterns AP2. The second trench TR2 may be formed by patterning a portion of the substrate 100 between the first and second active regions PR and NR. The second trench TR2 may be formed to have a depth that is larger than that of the first trench TR1.

The device isolation layer ST may be formed on the substrate 100 to fill the first and second trenches TR1 and TR2. The device isolation layer ST may be formed of or include an insulating material (e.g., silicon oxide). The device isolation layer ST may be recessed to expose upper portions of the first and second active patterns AP1 and AP2. For example, the upper portions of the first and second active patterns AP1 and AP2 may protrude vertically above the device isolation layer ST.

Figure 7:
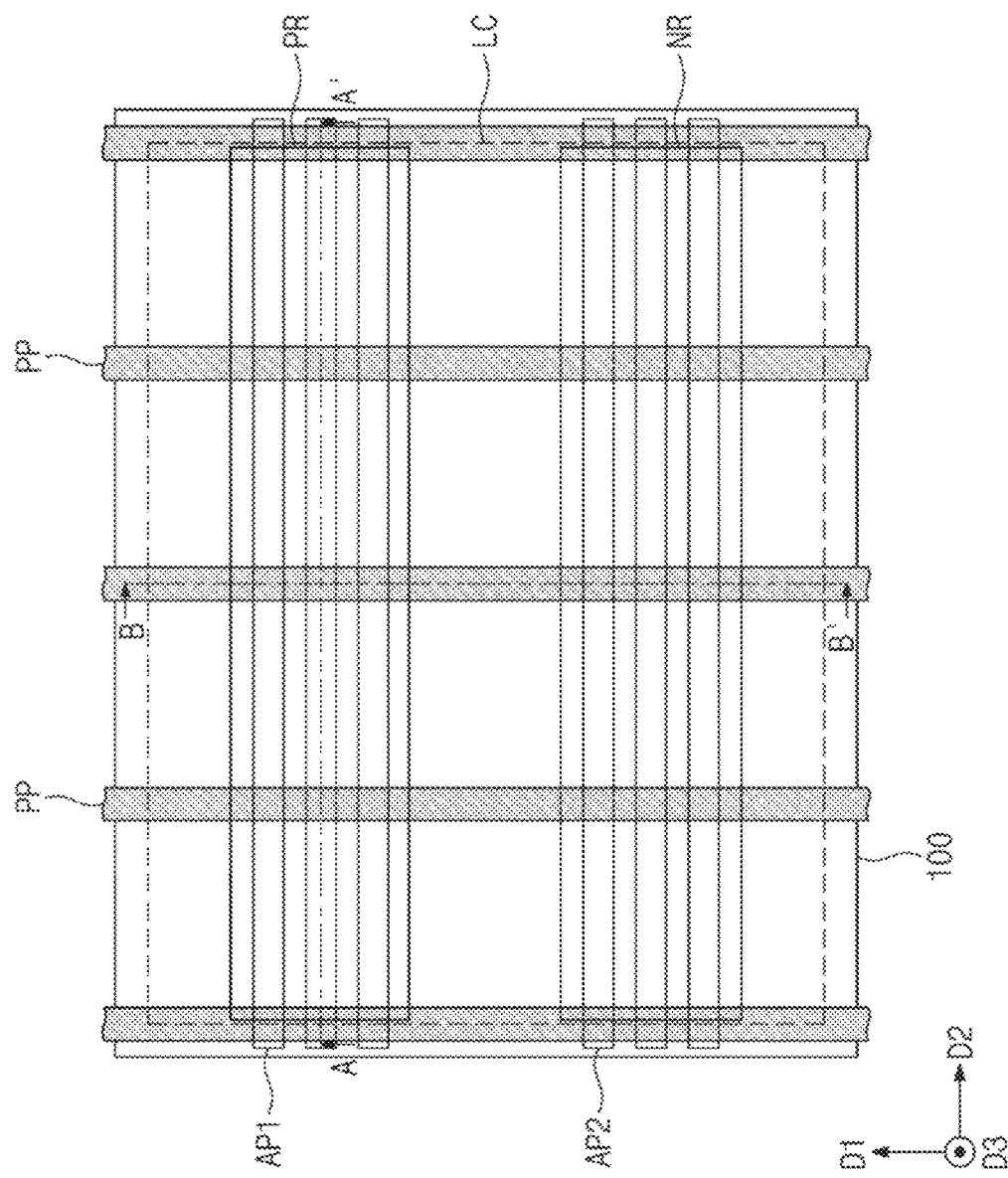
Figure 8A:
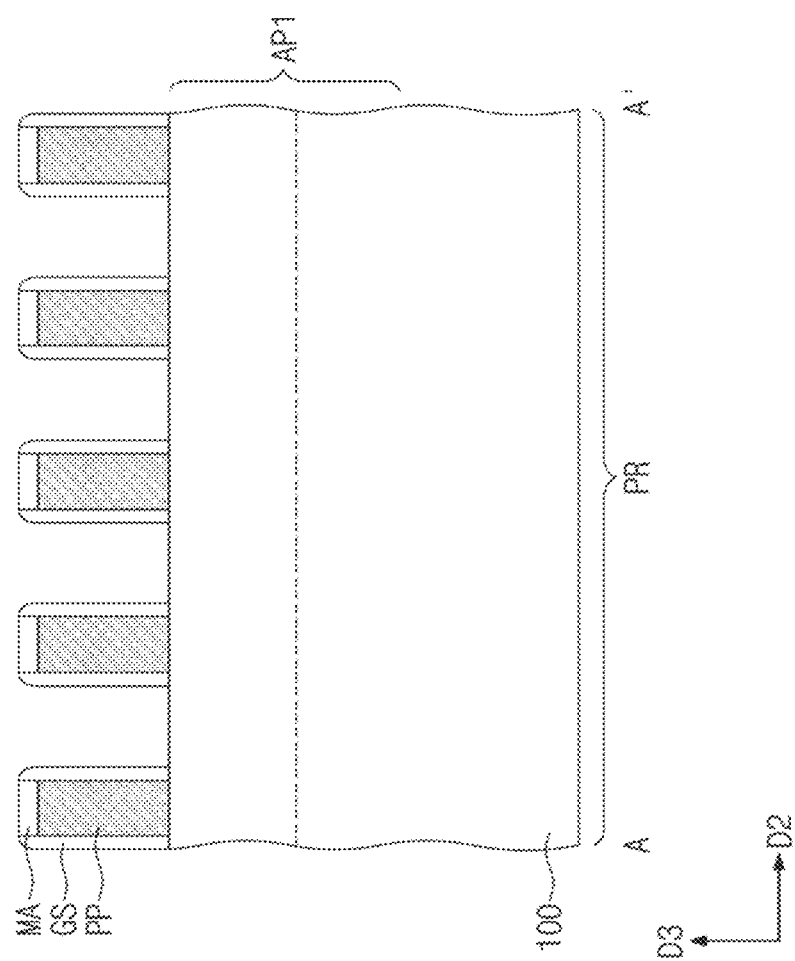
Figure 8B:
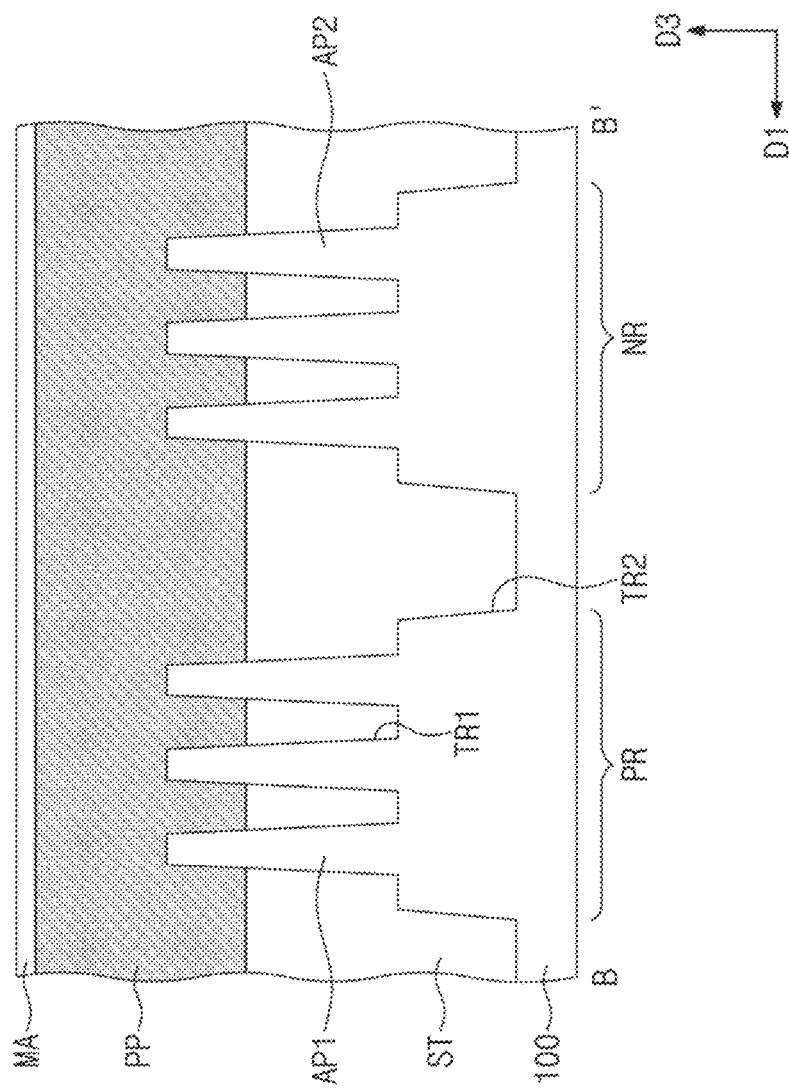
FIGS. 8B, 10B, and 12B are sectional views taken along lines B-B' of FIGS. 7, 9, and 11, respectively.
Figure 9:
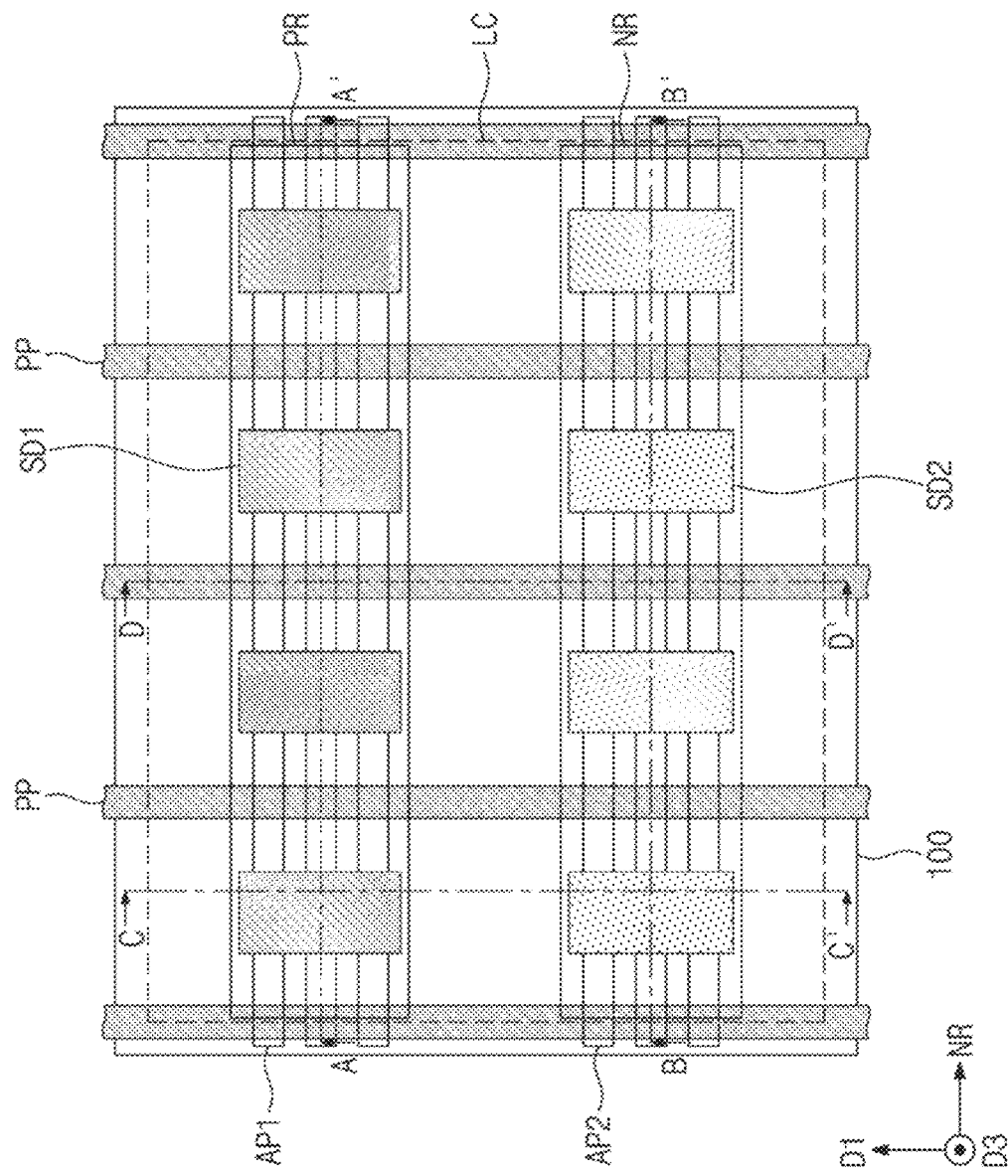

Referring to FIGS. 7, 8A, and 8B, sacrificial patterns PP may be formed to cross the first and second active patterns AP1 and AP2. The sacrificial patterns PP may be formed to have a line or bar shape extending in the first direction D1. As shown in FIG. 1, the sacrificial patterns PP may be formed to be spaced apart from each other with the first pitch P1 in the second direction D2.

In detail, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include poly silicon.

A pair of the gate spacers GS may be formed on both side surfaces of each of the sacrificial patterns PP. The formation of the gate spacers GS may include conformally forming a gate spacer layer on the substrate 100 and anisotropically etching the gate spacer layer. In some example embodiments, the gate spacer layer may be formed of or include at least one of SiCN, SiCON, or SiN. In some example embodiments, the gate spacer layer may be a multi-layered structure including at least two of SiCN, SiCON, or SiN layers.

Referring to FIGS. 9 and 10A to 10D, the first source/drain patterns SD1 may be formed in an upper portion of the first active pattern AP1. A pair of the first source/drain patterns SD1 may be formed at both sides of each of the sacrificial patterns PP.

In detail, first recesses RSR1 may be formed by etching the upper portion of the first active pattern AP1 using the hard mask patterns MA and the gate spacers GS as an etch mask. The device isolation layer ST between the first active patterns AP1 may be recessed during the etching of the upper portion of the first active pattern AP1 (e.g., see FIG. 10C).

The first source/drain pattern SD1 may be formed by performing a selective epitaxial growth process using an inner side surface of the first recess RSR1 of the first active pattern AP1 as a seed layer. As a result of the formation of the first source/drain patterns SD1, the first channel pattern CH1 may be defined between each pair of the first source/drain patterns SD1. In some example embodiments, the selective epitaxial growth process may include a chemical vapor deposition (CVD) process or a molecular beam epitaxy (MBE) process. The first source/drain patterns SD1 may include a semiconductor element (e.g., SiGe), whose lattice constant is larger than a lattice constant of a semiconductor element in the substrate 100. Each of the first source/drain patterns SD1 may be a multi-layered structure including a plurality of semiconductor layers.

In some example embodiments, the first source/drain patterns SD1 may be doped in situ during a selective epitaxial growth process. In some example embodiments, impurities may be injected into the first source/drain patterns SD1, after the formation of the first source/drain patterns SD1. The first source/drain patterns SD1 may be doped to have a first conductivity type (e.g., p-type).

The second source/drain patterns SD2 may be formed on the second active pattern AP2. A pair of the second source/drain patterns SD2 may be formed at both sides of each of the sacrificial patterns PP.

In detail, second recesses RSR2 may be formed by etching an upper portion of the second active pattern AP2 using the hard mask patterns MA and the gate spacers GS as an etch mask. The second source/drain pattern SD2 may be formed by performing a selective epitaxial growth process using an inner side surface of the second recess RSR2 of the second active pattern AP2 as a seed layer, may be performed to form. As a result of the formation of the second source/drain patterns SD2, the second channel pattern CH2 may be defined between each pair of the second source/drain patterns SD2. In some example embodiments, the second source/drain patterns SD2 may include the semiconductor element (e.g., Si) as the substrate 100. The second source/drain patterns SD2 may be doped to have a second conductivity type (e.g., n-type).

The first source/drain patterns SD1 and the second source/drain patterns SD2 may be sequentially formed through different processes. In other words, the second source/drain patterns SD2 of the first source/drain patterns SD1 may not be formed at the same time.

Referring to FIGS. 11 and 12A to 12D, the first interlayered insulating layer 110 may be formed to cover the first and second source/drain patterns SD1 and SD2, the hard mask patterns MA, and the gate spacers GS. In some example embodiments, the first interlayered insulating layer 110 may be formed of or include silicon oxide.

The first interlayered insulating layer 110 may be planarized to expose the top surfaces of the sacrificial patterns PP. The planarization of the first interlayered insulating layer 110 may be performed using an etch-back or chemical mechanical polishing (CMP) process. In some example embodiments, the planarization process may be performed to fully remove the hard mask patterns MA. Accordingly, the first interlayered insulating layer 110 may have a top surface that is coplanar with the top surfaces of the sacrificial patterns PP and the top surfaces of the gate spacers GS.

The sacrificial patterns PP may be replaced with the gate electrodes GE, respectively. For example, the exposed sacrificial patterns PP may be selectively removed. As a result of the removal of the sacrificial patterns PP, empty spaces may be formed. The gate dielectric pattern GI, the gate electrode GE, and the gate capping pattern GP may be formed in each of the empty spaces. The gate electrode GE may include a first metal pattern and a second metal pattern on the first metal pattern. The first metal pattern may be formed of a work function metal capable of adjusting a threshold voltage of a transistor, and the second metal pattern may be formed of a metallic material whose resistance is low.

The second interlayered insulating layer 120 may be formed on the first interlayered insulating layer 110. The second interlayered insulating layer 120 may be formed of or include silicon oxide. The active contacts AC may be formed to penetrate the second interlayered insulating layer 120 and the first interlayered insulating layer 110 and to be electrically connected to the first and second source/drain patterns SD1 and SD2. The gate contact GC may be formed to penetrate the second interlayered insulating layer 120 and the gate capping pattern GP and to be electrically connected to the gate electrode GE.

A pair of the isolation structures DB may be formed along both sides of the logic cell LC, which are opposite to each other in the second direction D2. The isolation structures DB may be formed to be overlapped with the gate electrodes GE, which are formed at the both sides of the logic cell LC. For example, the formation of the isolation structures DB may include forming a hole, which is extended into the first and second active patterns AP1 and AP2 through the first and second interlayered insulating layers 110 and 120 and the gate electrode GE, and then filling the hole with an insulating layer.

Referring back to FIGS. 1 and 2A to 2D, the third interlayered insulating layer 130 may be formed on the second interlayered insulating layer 120. The first metal layer M1 may be formed in the third interlayered insulating layer 130. The formation of the first metal layer M1 may include forming the first lower interconnection lines LIL1, the second lower interconnection lines LIL2, and the lower vias VI.

The etch stop layer ESL may be formed on the first metal layer M1. The fourth interlayered insulating layer 140 may be formed on the etch stop layer ESL. The second metal layer M2 may be formed in the fourth interlayered insulating layer 140. The formation of the second metal layer M2 may include forming the upper interconnection lines UIL. The upper interconnection lines UIL may be formed by a dual damascene process.

Figure 2A:
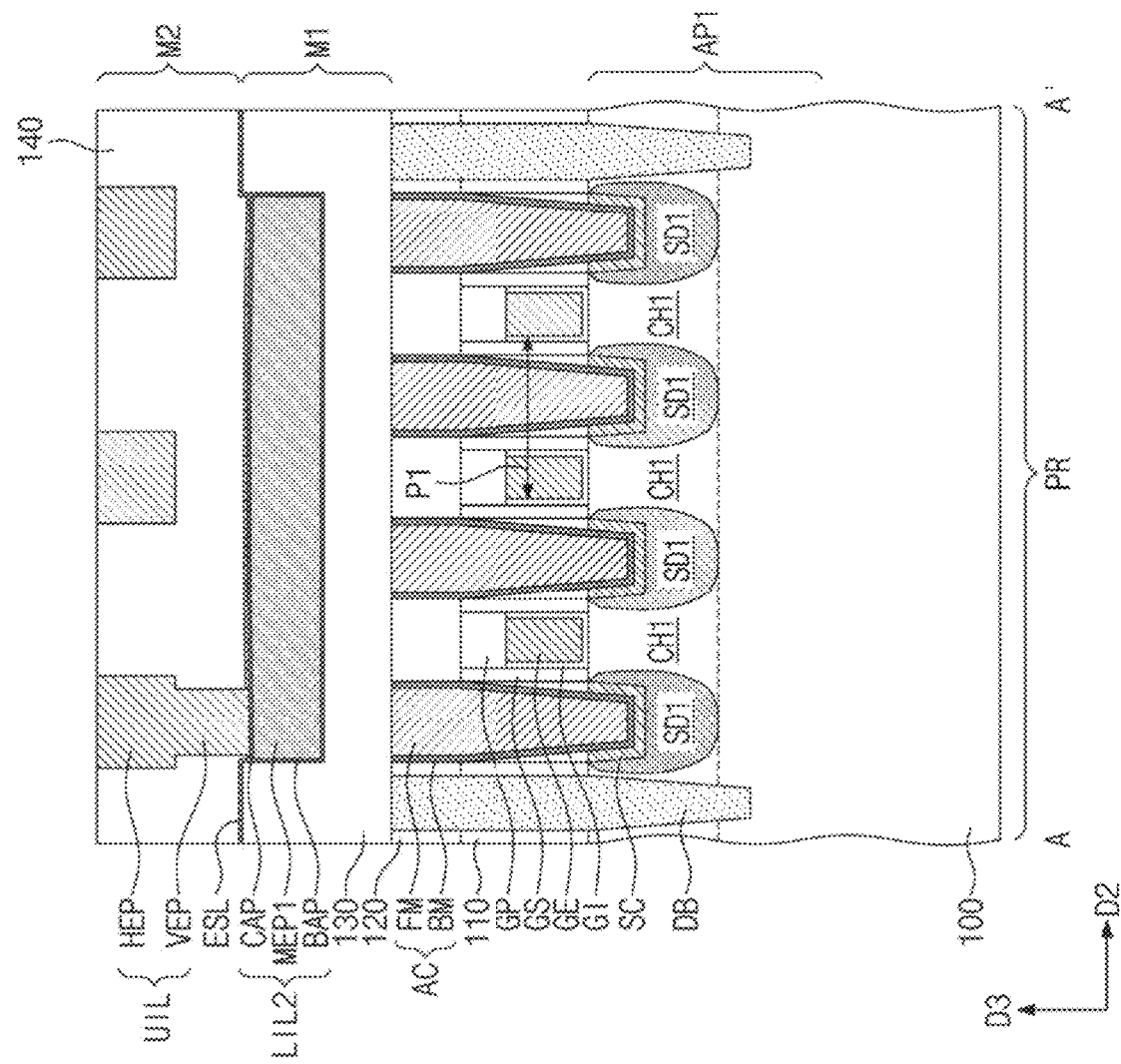
FIGS. 2A to 2D are sectional views taken along lines A-A', B-B', C-C', and D-D', respectively, of FIG. 1.
Figure 2B:
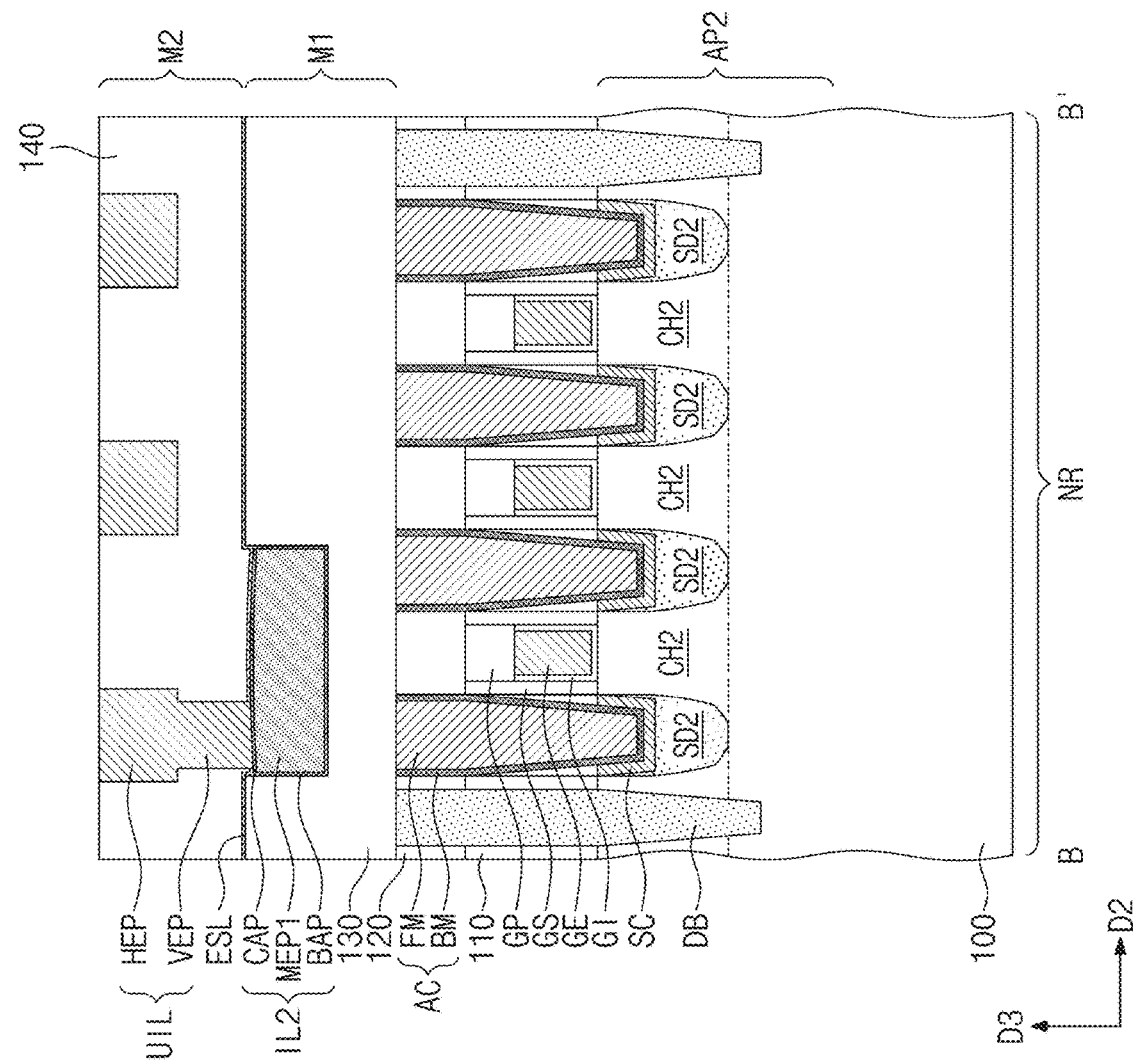
Figure 2C:
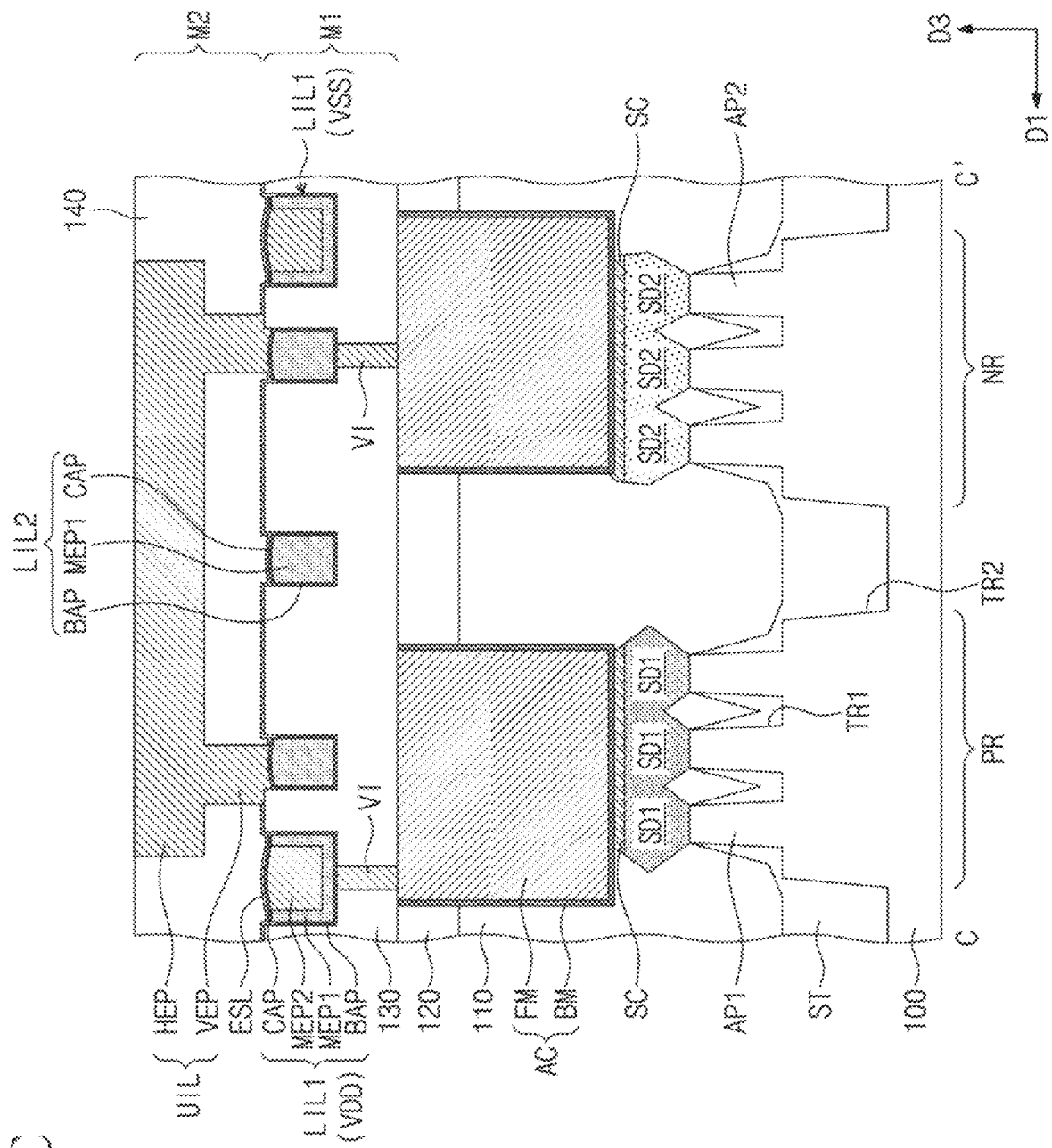
Figure 2D:
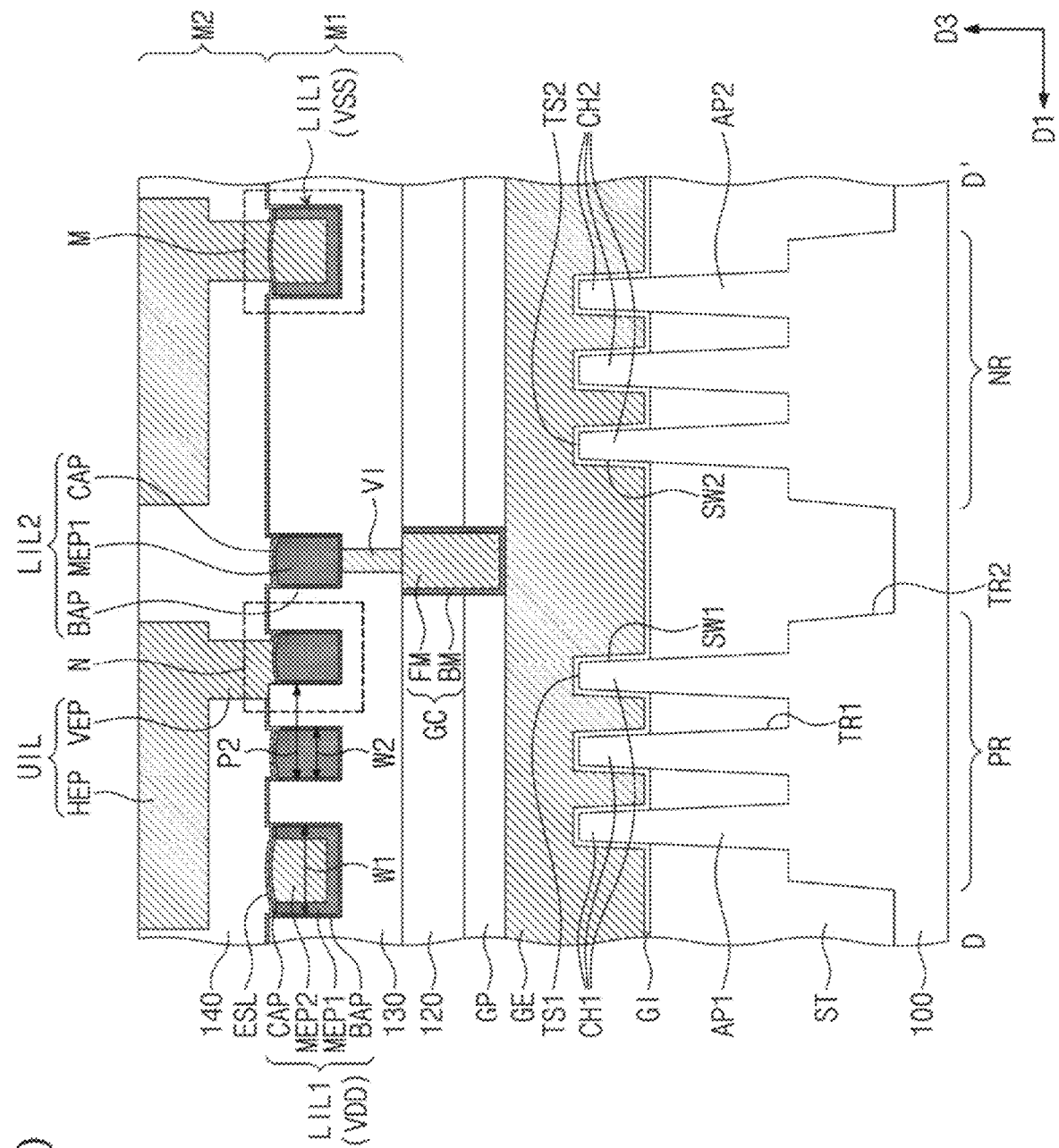
Figure 3:
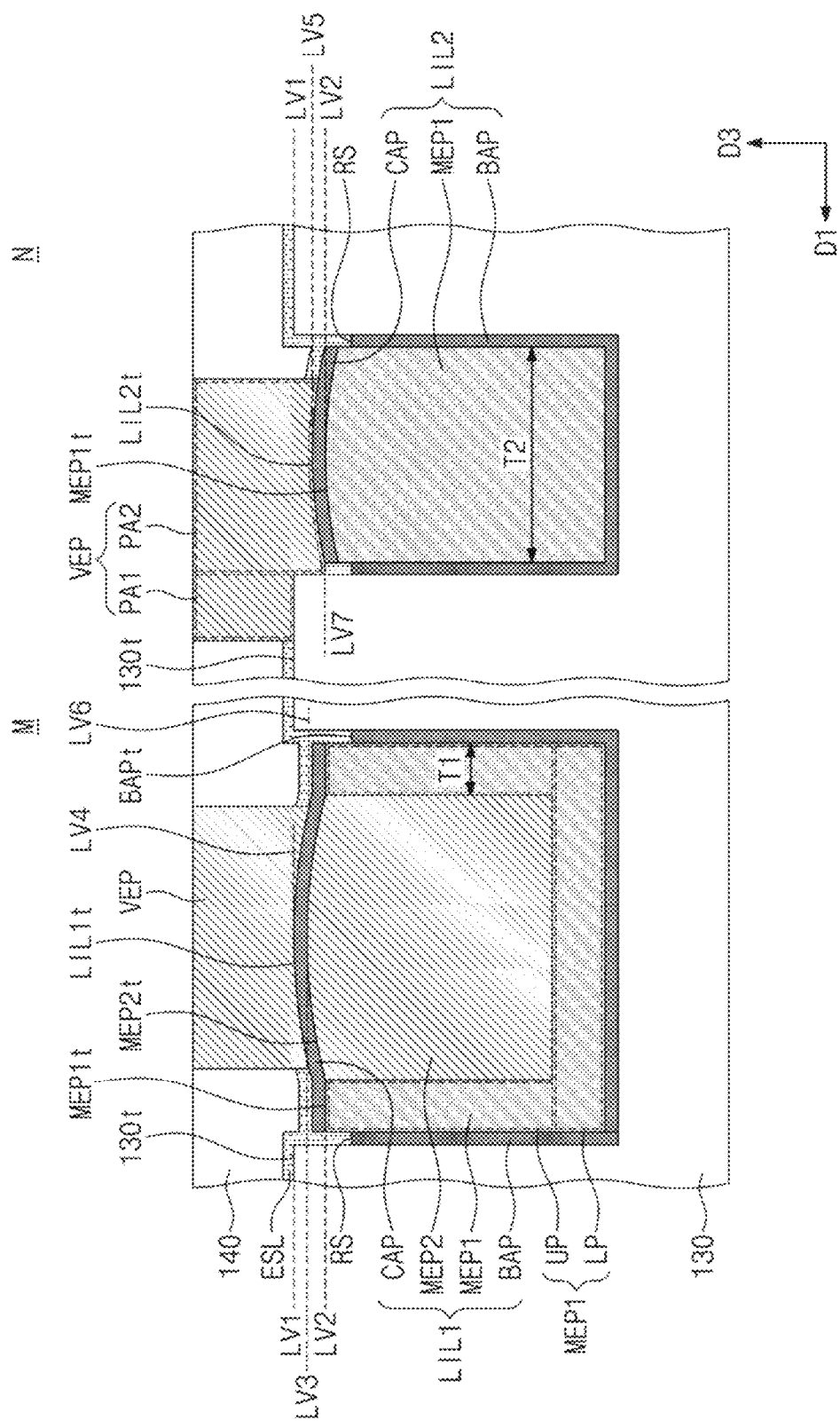
FIG. 3 is an enlarged sectional view illustrating portions M and N of FIG. 2D.

FIGS. 13 to 19 are enlarged sectional views illustrating a method of forming a lower interconnection line according to some example embodiments of the inventive concepts and in particular illustrating the portions M and N of FIG. 2D. Hereinafter, a method of forming the first and second lower interconnection lines LIL1 and LIL2 according to some example embodiments of the inventive concepts will be described in more detail with reference to FIGS. 13 to 19.

Figure 13:
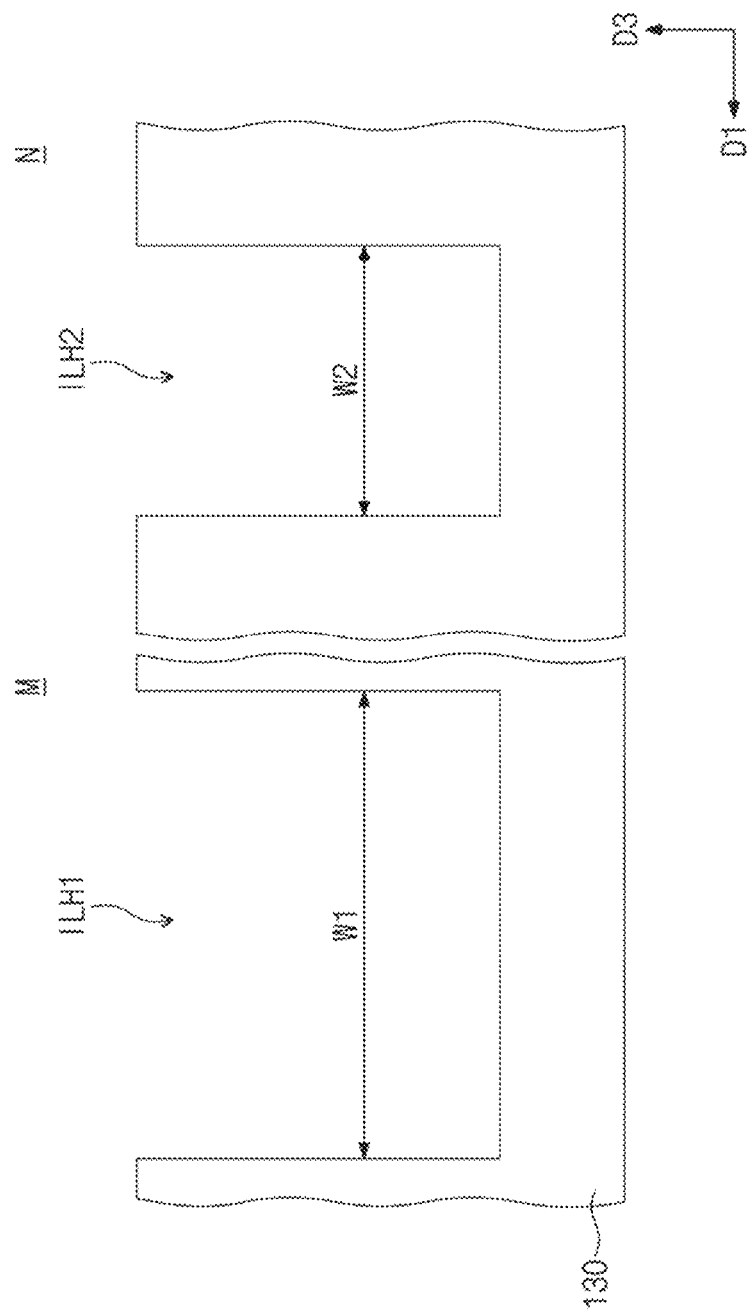
FIGS. 13 to 19 are enlarged sectional views illustrating a method of forming a lower interconnection line according to some example embodiments of the inventive concepts and in particular illustrating the portions M and N of FIG. 2D.

Referring to FIG. 13, a first wire hole ILH1 and a second wire hole ILH2 may be formed by patterning an upper portion of the third interlayered insulating layer 130. Each of the first and second wire holes ILH1 and ILH2 may be a line-shaped groove that is extended in the second direction D2. The first and second wire holes ILH1 and ILH2 may define regions, in which the first and second lower interconnection lines LIL1 and LIL2 will be formed.

The first wire hole ILH1 may have the first width W1 in the first direction D1. The second wire hole ILH2 may have the second width W2 in the first direction D1. The first width W1 may be larger than the second width W2.

Figure 14:
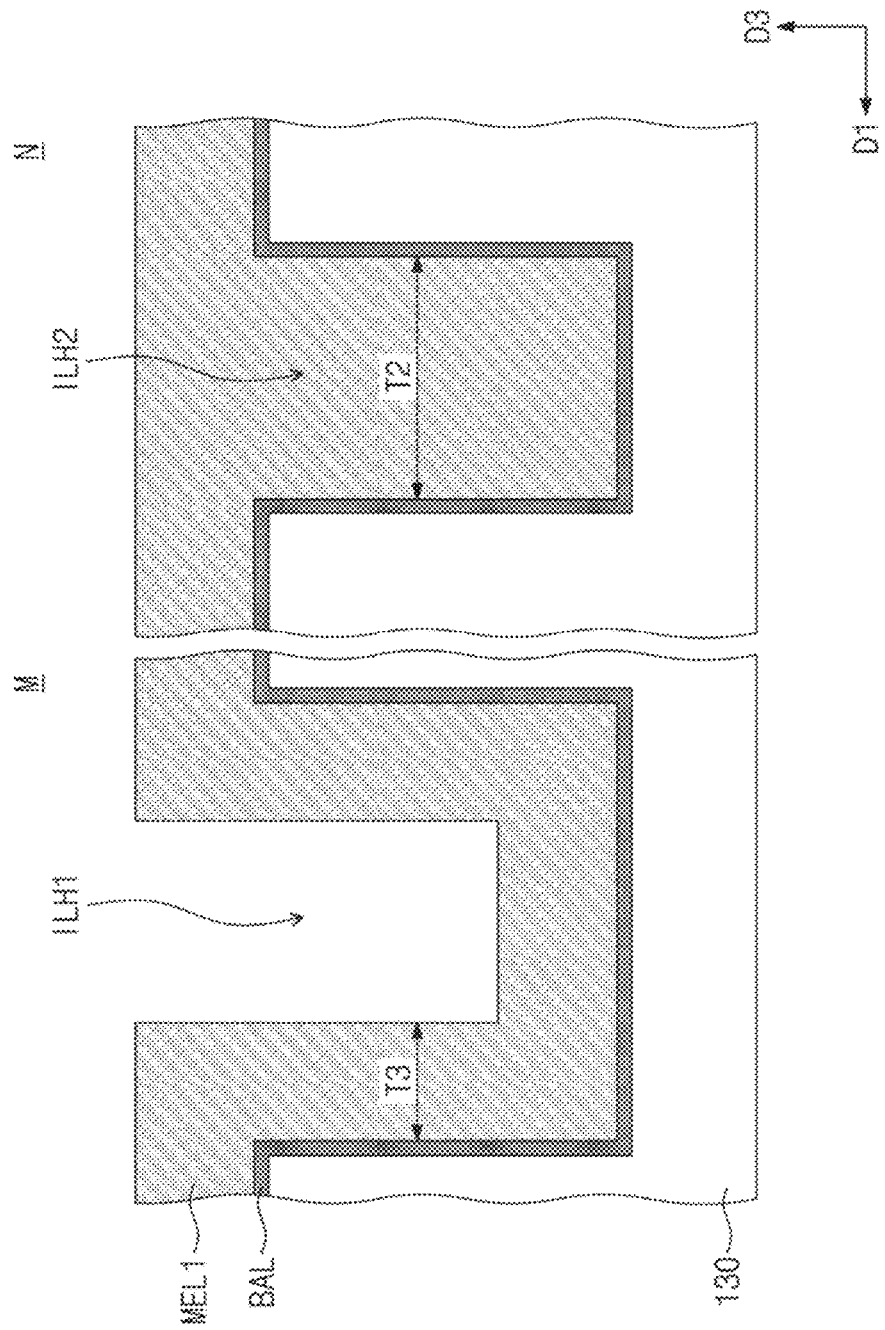

Referring to FIG. 14, a barrier layer BAL and a first metal layer MEL1 may be sequentially formed in the first and second wire holes ILH1 and ILH2. The barrier layer BAL may be formed to have a thin and uniform thickness. The barrier layer BAL may be formed using an atomic layer deposition process (ALD), a chemical vapor deposition process (CVD), or a physical vapor deposition process (PVD).

The barrier layer BAL may serve as an adhesion layer allowing the first metal layer MEL1, which will be formed thereon in a subsequent step, to be stably attached thereto. The barrier layer BAL may be formed of or include at least one of tantalum nitride (TaN), titanium nitride (TiN), tantalum oxide (TaO), titanium oxide (TiO), manganese nitride (MnN), or manganese oxide (MnO).

The first metal layer MEL1 may be conformally formed on the third interlayered insulating layer 130. The first metal layer MEL1 may be formed using the ALD or CVD process. The first metal layer MEL1 may be formed to partially fill the first wire hole ILH1 and to fully fill the second wire hole ILH2.

For example, the first metal layer MEL1 may be formed to have a third thickness T3 in the first direction D1 on an inner side surface of the first wire hole ILH1. The first metal layer MEL1 on an inner side surface of the second wire hole ILH2 may have the second thickness T2 in the first direction D1. The third thickness T3 may be larger than half of the second thickness T2.

The first metal layer MEL1 may be formed of or include a metallic material (e.g., ruthenium (Ru), cobalt (Co), tungsten (W), or molybdenum (Mo)) having a relatively small eMFP value. The first metal layer MEL1 filling the second wire hole ILH2 may have a low resistivity property, when it has a relatively small thickness (e.g., the second thickness T2 or of 12 nm or less).

After the formation of the first metal layer MEL1, a thermal treatment process may be performed on the first metal layer MEL1. The resistivity of the first metal layer MEL1 may be further lowered by the thermal treatment process.

Figure 15:
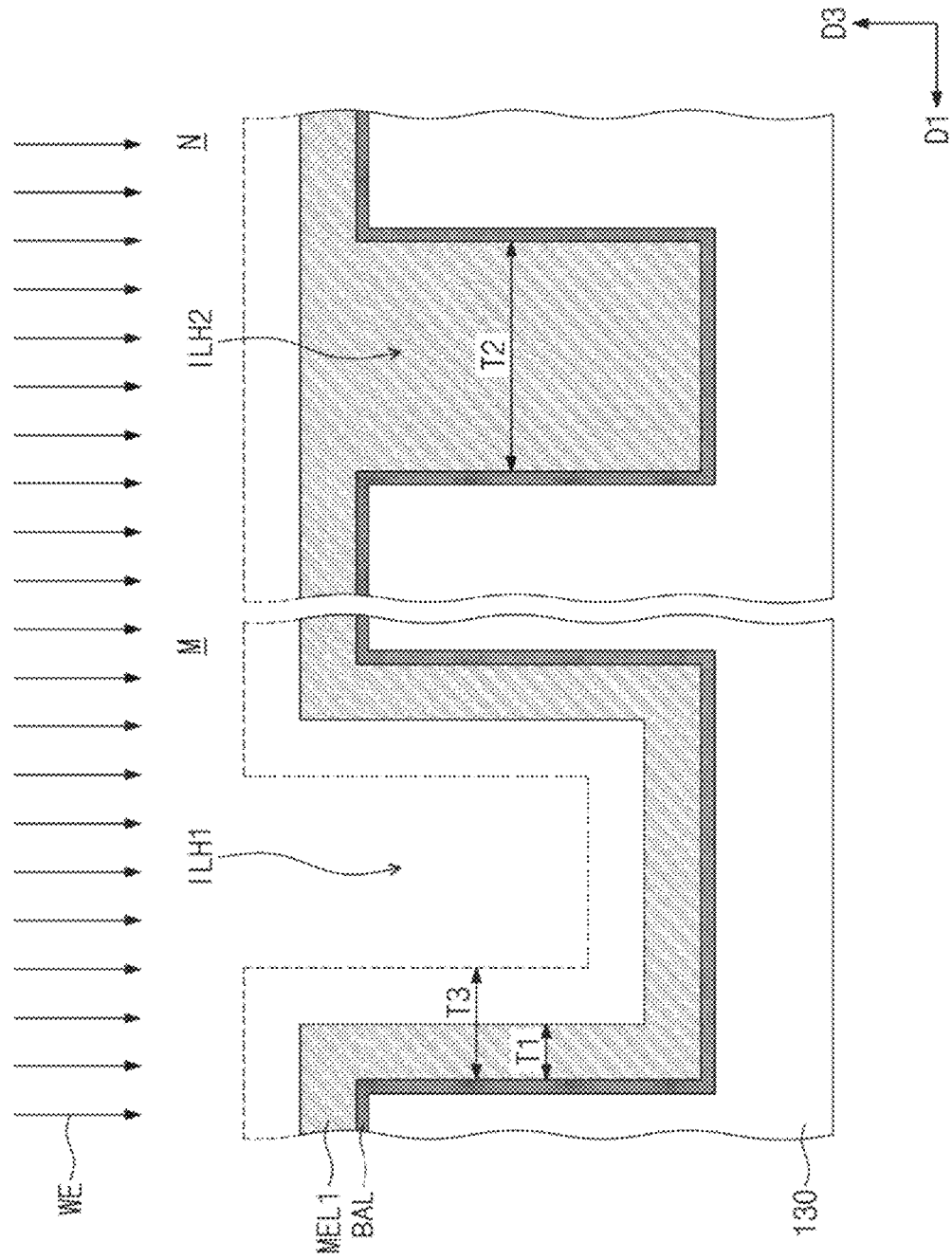

Referring to FIG. 15, an etching process WE may be performed on the first metal layer MEL1 to isotropically decrease the thickness of the first metal layer MEL1. In some example embodiments, the etching process WE may include an isotropic etching process (e.g., a wet etching process). In some example embodiments, the etching process WE may be performed using a dry etching process.

As a result of the etching process WE, the overall thickness of the first metal layer MEL1 in the first wire hole ILH1 may be reduced. For example, the thickness of the first metal layer MEL1 on the inner side surface of the first wire hole ILH1 may be reduced from the third thickness T3 to the first thickness T1. In other words, the volume of the first metal layer MEL1 in the first wire hole ILH1 may be reduced.

During the etching process WE, the thickness of the first metal layer MEL1 on the second wire hole ILH2 may be reduced in a region, which is located on the third interlayered insulating layer 130 but the first metal layer MEL1 in the second wire hole ILH2 may not be affected by the etching process WE. The first metal layer MEL1 on the inner side surface of the second wire hole ILH2 may be maintained to the second thickness T2. In other words, the etching process WE may reduce the volume of the first metal layer MEL1 in the first wire hole ILH1 but may not lead to a change in volume of the first metal layer MEL1 in the second wire hole ILH2.

Figure 16:
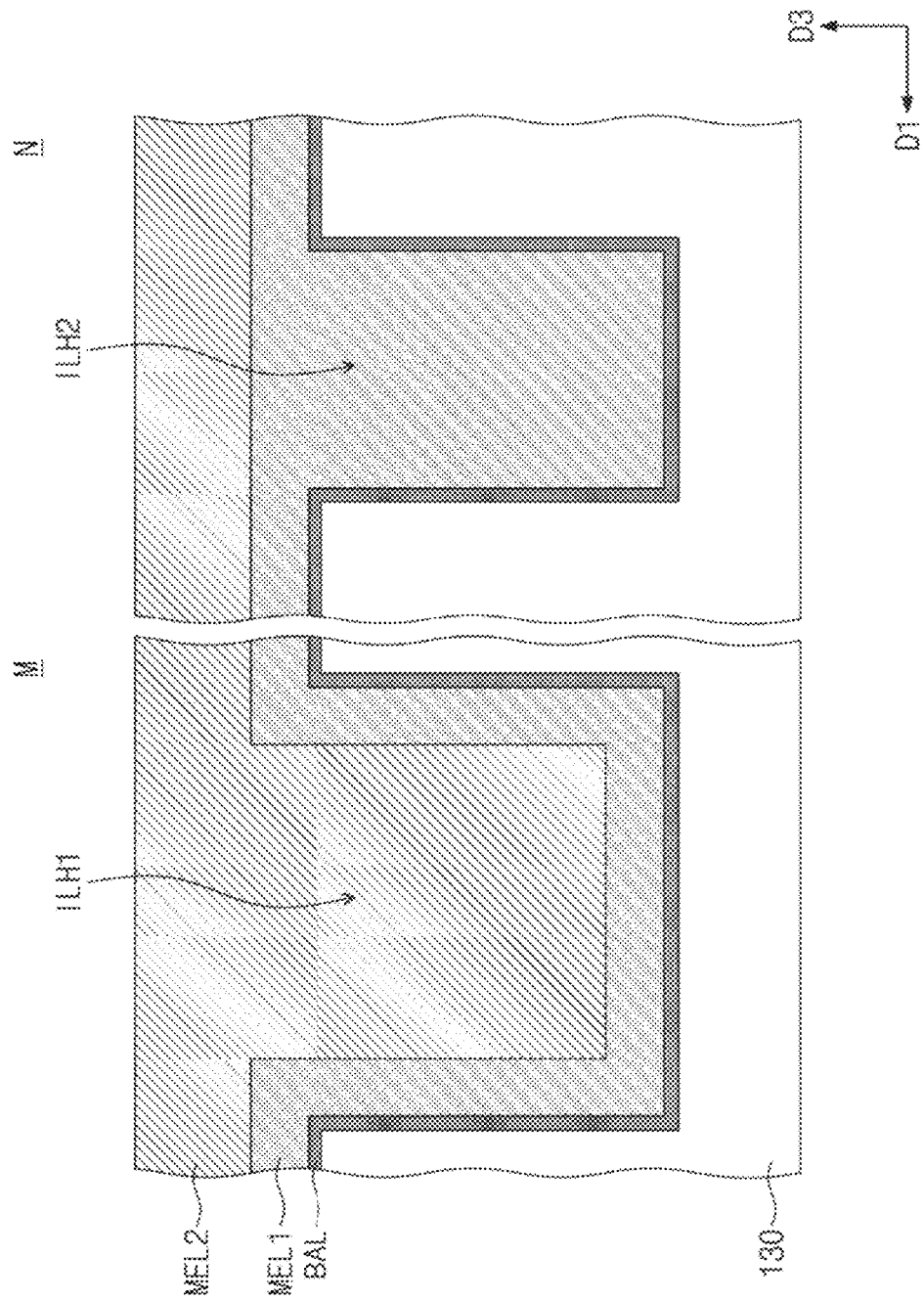

Referring to FIG. 16, a second metal layer MEL2 may be formed on the first metal layer MEL1. The second metal layer MEL2 may be formed to fully fill the first wire hole ILH1. Since the second wire hole ILH2 is already filled with the first metal layer MEL1, the second metal layer MEL2 may not be formed in the second wire hole ILH2. The second metal layer MEL2 may be formed using a reflow process or an electroplating process.

The second metal layer MEL2 may be formed of or include a metallic material that is different from the first metal layer MEL1. The second metal layer MEL2 may be formed of or include a metallic material (e.g., copper (Cu)) having a relatively large eMFP. As a result of the etching process WE described above, it may be possible to maximize the volume of the second metal layer MEL2 filling the first wire hole ILH1. The second metal layer MEL2 filling the first wire hole ILH1 of a relatively large width may have a low resistivity property.

Figure 17:
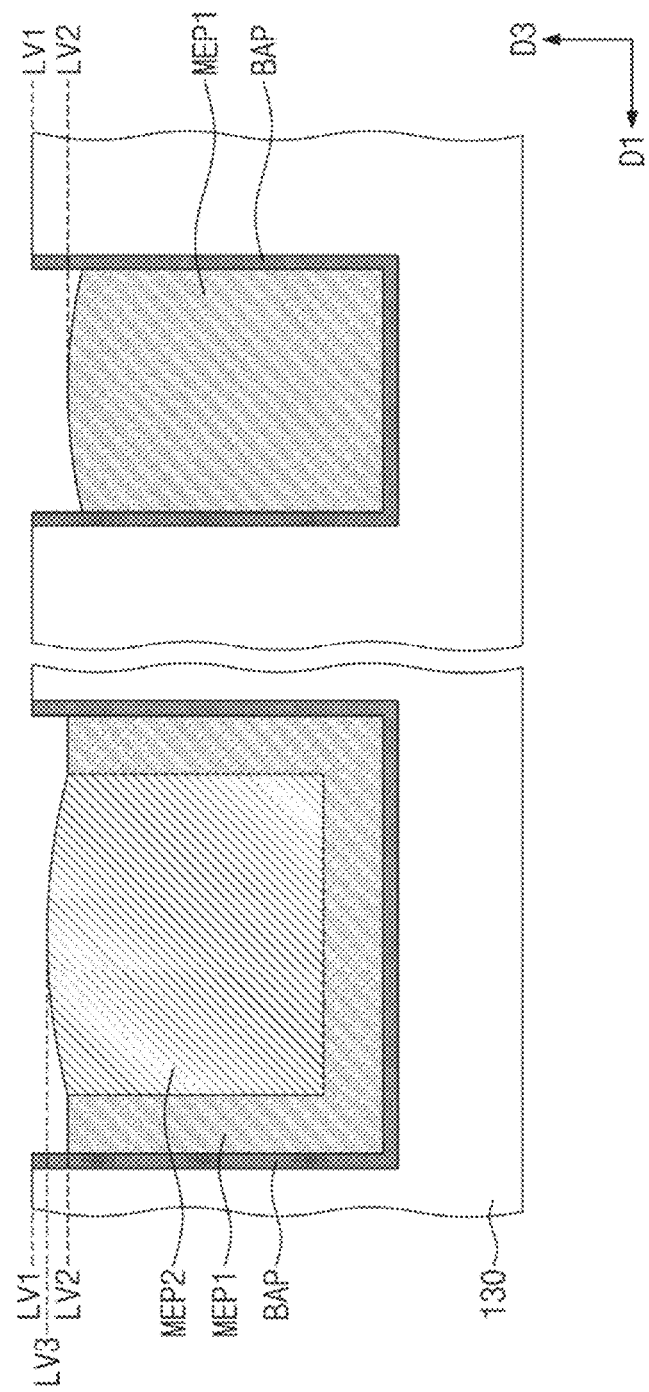

Referring to FIG. 17, a planarization process (e.g., CMP process) may be performed until the top surface of the third interlayered insulating layer 130 is exposed to the outside. Accordingly, the barrier metal pattern BAP, the first metal pattern MEP1, and the second metal pattern MEP2 may be formed from the barrier layer BAL, the first metal layer MEL1, and the second metal layer MEL2, respectively.

During the planarization process, the first metal pattern MEP1 may be more recessed than the second metal pattern MEP2. After the planarization process, the highest level of the top surface of the first metal pattern MEP1 may be located at the second level LV2. The highest level of the top surface of the second metal pattern MEP2 may be located at the third level LV3. The third level LV3 may be higher than the second level LV2. The third level LV3 may be lower than the first level LV1 of the top surface of the third interlayered insulating layer 130.

Figure 18:
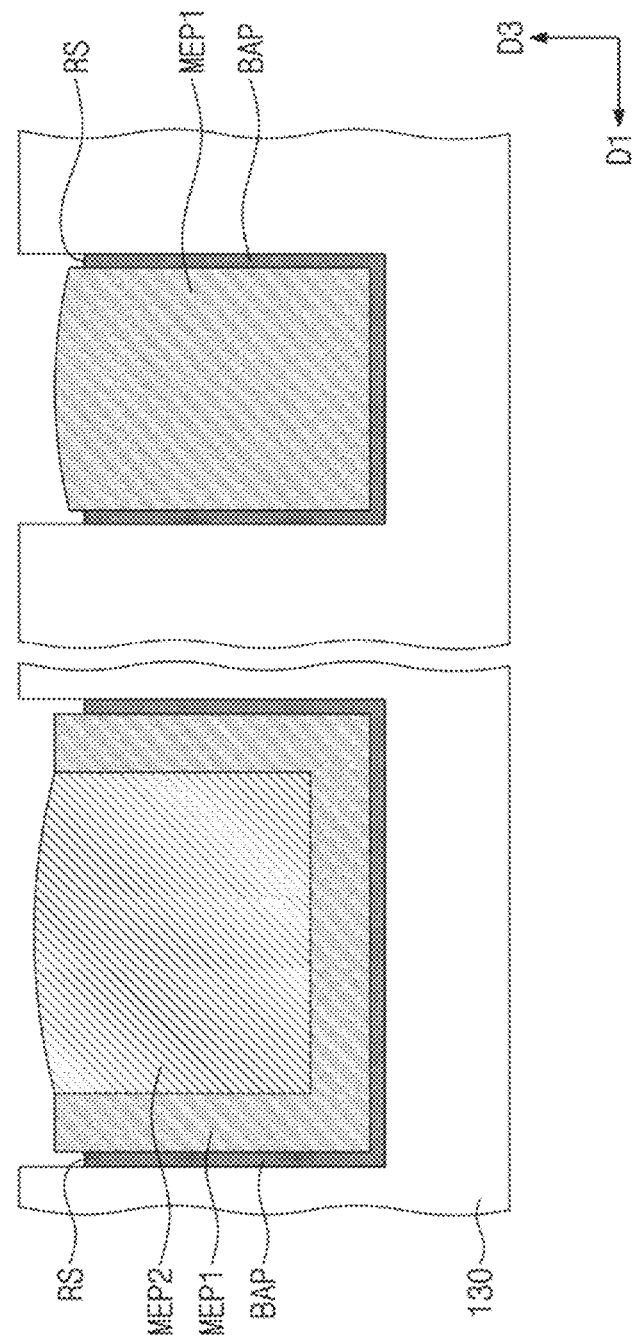

Referring to FIG. 18, an etching process may be performed to selectively recess the barrier metal pattern BAP. Due to the selective recessing of the barrier metal pattern BAP, the recess region RS may be formed between the third interlayered insulating layer 130 and the first metal pattern MEP1.

Figure 19:
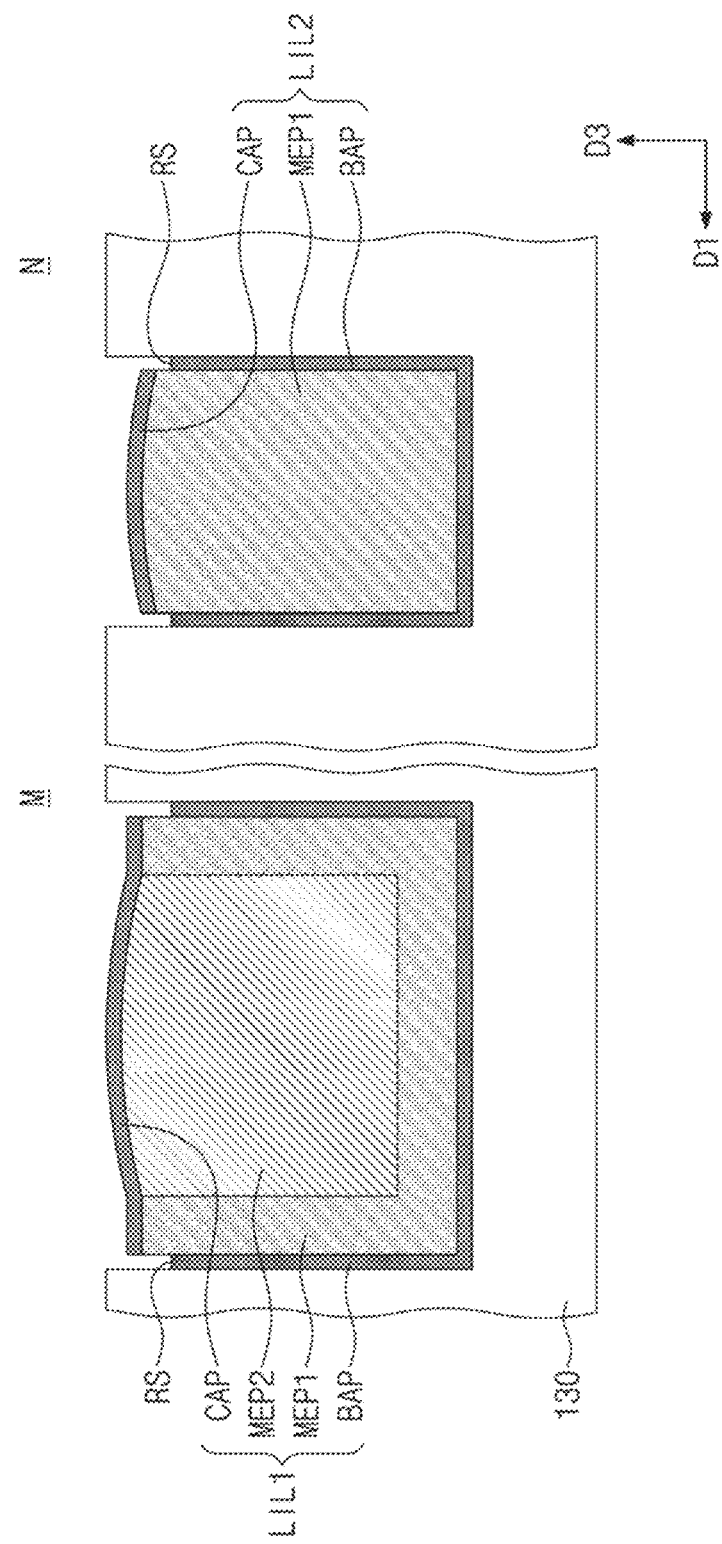

Referring to FIG. 19, the metal capping pattern CAP may be selectively formed on the top surfaces of the first and second metal patterns MEP1 and MEP2. The metal capping pattern CAP may be formed using a selective atomic layer deposition process or a selective chemical vapor deposition process. The metal capping pattern CAP may be formed of or include at least one of ruthenium (Ru), cobalt (Co), or graphene.

Figure 20:
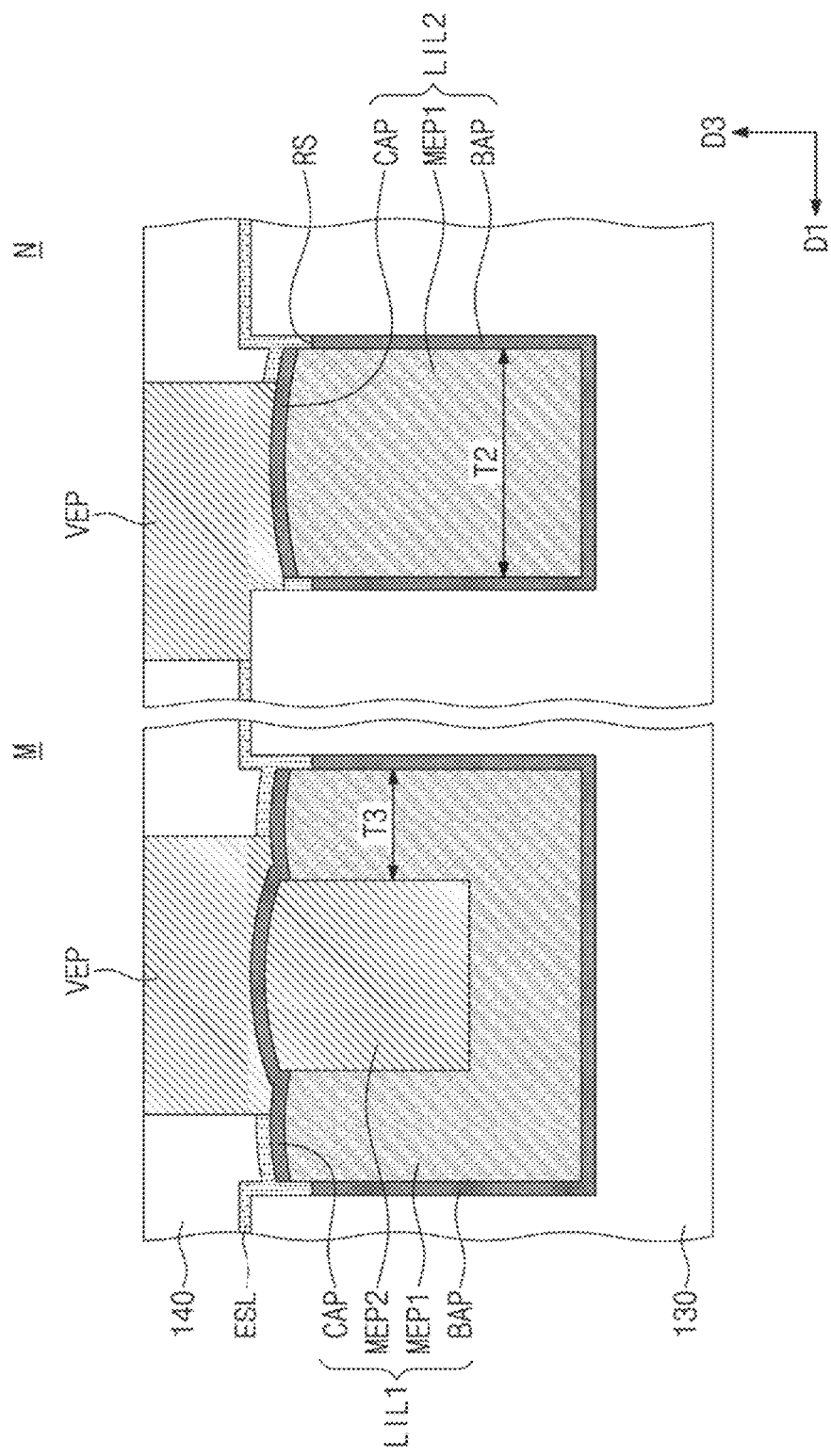
FIG. 20 is an enlarged sectional view illustrating a lower interconnection line according to some example embodiments of the inventive concepts and in particular illustrating the portions M and N of FIG. 2D.

FIG. 20 is an enlarged sectional view illustrating a lower interconnection line according to some example embodiments of the inventive concepts and in particular illustrating the portions M and N of FIG. 2D. For concise description, an element previously described with reference to FIG. 3 may be identified by the same reference number without repeating an overlapping description thereof.

Referring to FIG. 20, the first metal pattern MEP1 of the first lower interconnection line LIL1 may have the third thickness T3. The third thickness T3 may be larger than half of the second thickness T2 of the first metal pattern MEP1 of the second lower interconnection line LIL2. According to some example embodiments, the first metal pattern MEP1 of the first lower interconnection line LIL1 may be formed by omitting the etching process WE described with reference to FIG. 15.

In some example embodiments, the first metal pattern MEP1 of the first lower interconnection line LIL1 may have a curved top surface. In the first lower interconnection line LIL1, a volume of the first metal pattern MEP1 may be larger than a volume of the second metal pattern MEP2.

Figure 21:
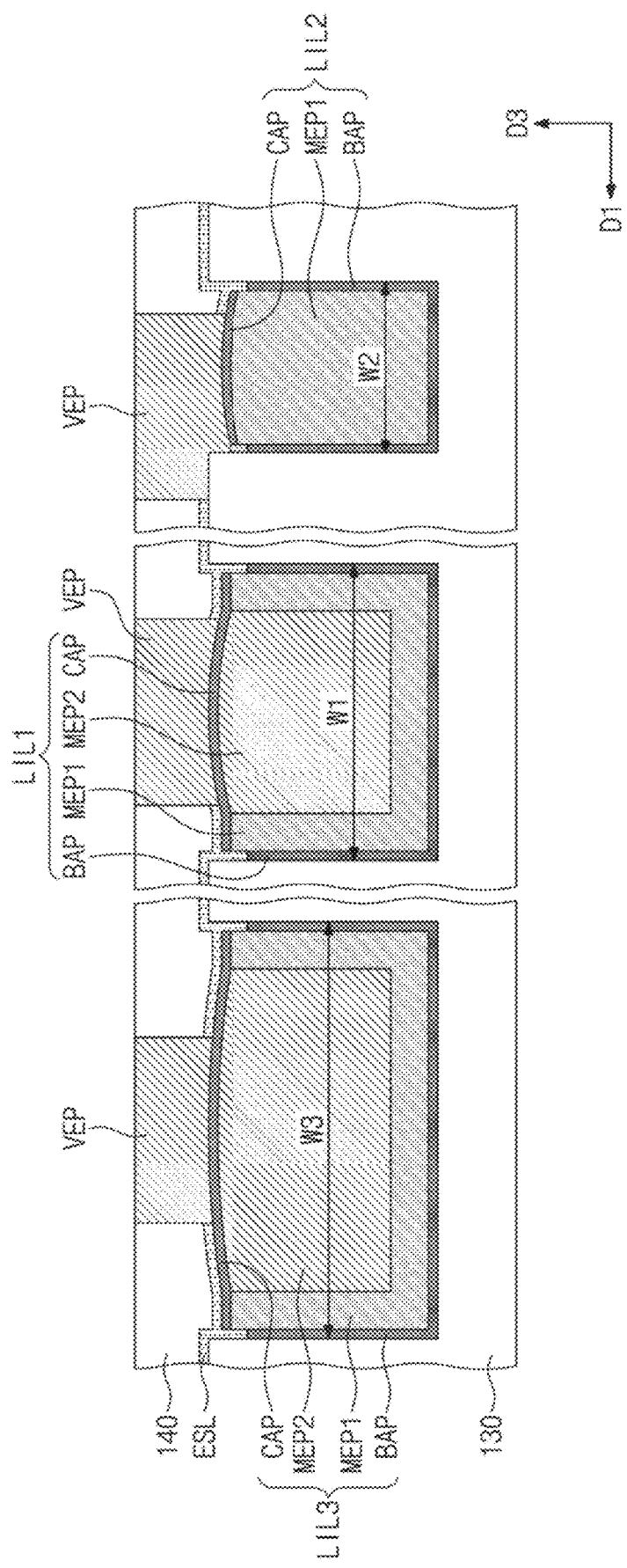
FIG. 21 is a sectional view illustrating lower interconnection lines according to some example embodiments of the inventive concepts.

FIG. 21 is a sectional view illustrating lower interconnection lines according to some example embodiments of the inventive concepts. Referring to FIG. 21, the lower interconnection lines may further include a third lower interconnection line LIL3, in addition to the first and second lower interconnection lines LIL1 and LIL2. A linewidth of the third lower interconnection line LIL3 may be a third width W3. The third width W3 may be larger than the first width W1 of the first lower interconnection line LIL1. In other words, according to some example embodiments of the inventive concepts, the lower interconnection lines of the semiconductor device may have various linewidths.

A volume ratio of the second metal pattern MEP2 in the third lower interconnection line LIL3 may be greater than a volume ratio of the second metal pattern MEP2 in the first lower interconnection line LIL1. Here, the volume ratio may be a ratio of a volume of the second metal pattern to a total volume of the lower interconnection line.

According to some example embodiments of the inventive concepts, if the linewidth of the lower interconnection line is increased, a volume ratio of a metallic material, which is provided in the lower interconnection line and has a large eMFP value, may be increased. Accordingly, the lower interconnection line may have low resistance, even when the linewidth of the lower interconnection line is increased.

Figure 22:
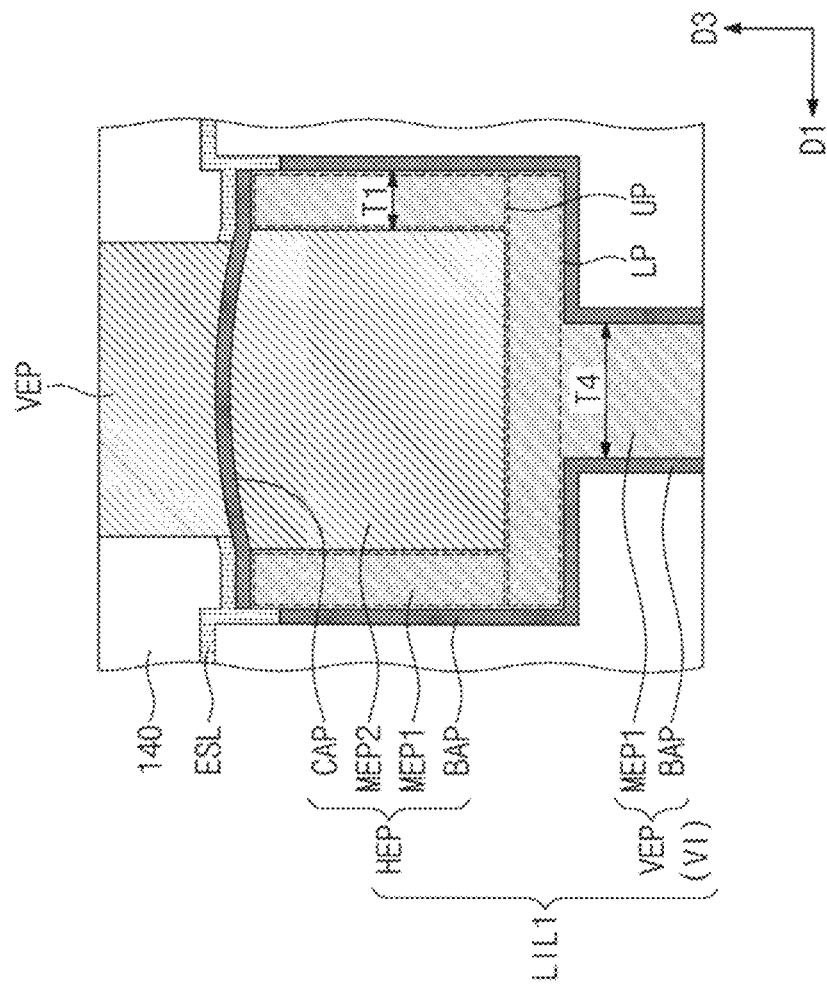
FIG. 22 is a sectional view illustrating a first lower interconnection line according to some example embodiments of the inventive concepts.

FIG. 22 is a sectional view illustrating a first lower interconnection line according to some example embodiments of the inventive concepts. Referring to FIG. 22, the first lower interconnection line LIL1 may include the line portion HEP and the via portion VEP. The via portion VEP of the first lower interconnection line LIL1 according to some example embodiments may correspond to the lower via VI according to FIG. 2C. For example, the first lower interconnection line LIL1 according to some example embodiments may include an interconnection line and a via plug, which are formed by a dual damascene process and constitute a single conductive structure.

The via portion VEP may be provided under the lower portion LP of the line portion HEP. The via portion VEP may include the barrier metal pattern BAP and the first metal pattern MEP1. A thickness of the via portion VEP in the first direction D1 may be a fourth thickness T4. The fourth thickness T4 may be larger than the first thickness T1. For example, the fourth thickness T4 may be less than or equal to 12 nm. Since the via portion VEP is formed of a metallic material having a relatively low eMFP, the resistance of the via portion VEP may be reduced.

FIGS. 23A to 23D are sectional views, which are respectively taken along lines A-A', B-B', C-C' and D-D' of FIG. 1 to illustrate a semiconductor device according to some example embodiments of the inventive concepts. For concise description, an element previously described with reference to FIGS. 1 and 2A to 2D may be identified by the same reference number without repeating an overlapping description thereof.

Referring to FIGS. 1 and 23A to 23D, the substrate 100 including the first and second active regions PR and NR may be provided. The device isolation layer ST may be provided on the substrate 100. The device isolation layer ST may define the first and second active patterns AP1 and AP2 in an upper portion of the substrate 100. The first and second active patterns AP1 and AP2 may be defined on the first and second active regions PR and NR, respectively.

The first active pattern AP1 may include the first channel patterns CH1, which are vertically stacked on the substrate 100. The stacked first channel patterns CH1 may be spaced apart from each other in the third direction D3. The stacked first channel patterns CH1 may be overlapped with each other, when viewed in a plan view. The second active pattern AP2 may include the second channel patterns CH2, which are vertically stacked on the substrate 100. The stacked second channel patterns CH2 may be spaced apart from each other in the third direction D3. The stacked second channel patterns CH2 may be overlapped with each other, when viewed in a plan view. The first and second channel patterns CH1 and CH2 may be formed of or include at least one of silicon (Si), germanium (Ge), silicon germanium (SiGe).

The first active pattern AP1 may further include the first source/drain patterns SD1. The stacked first channel patterns CH1 may be interposed between each adjacent pair of the first source/drain patterns SD1. The stacked first channel patterns CH1 may connect each adjacent pair of the first source/drain patterns SD1 to each other.

The second active pattern AP2 may further include the second source/drain patterns SD2. The stacked second channel patterns CH2 may be interposed between each adjacent pair of the second source/drain patterns SD2. The stacked second channel patterns CH2 may connect each adjacent pair of the second source/drain patterns SD2 to each other.

The gate electrodes GE may be provided to extend in the first direction D1 and to cross the first and second channel patterns CH1 and CH2. The gate electrode GE may be overlapped with the first and second channel patterns CH1 and CH2, when viewed in a plan view. A pair of the gate spacers GS may be disposed on both side surfaces of the gate electrode GE. The gate capping pattern GP may be provided on the gate electrode GE.

Figure 23A:
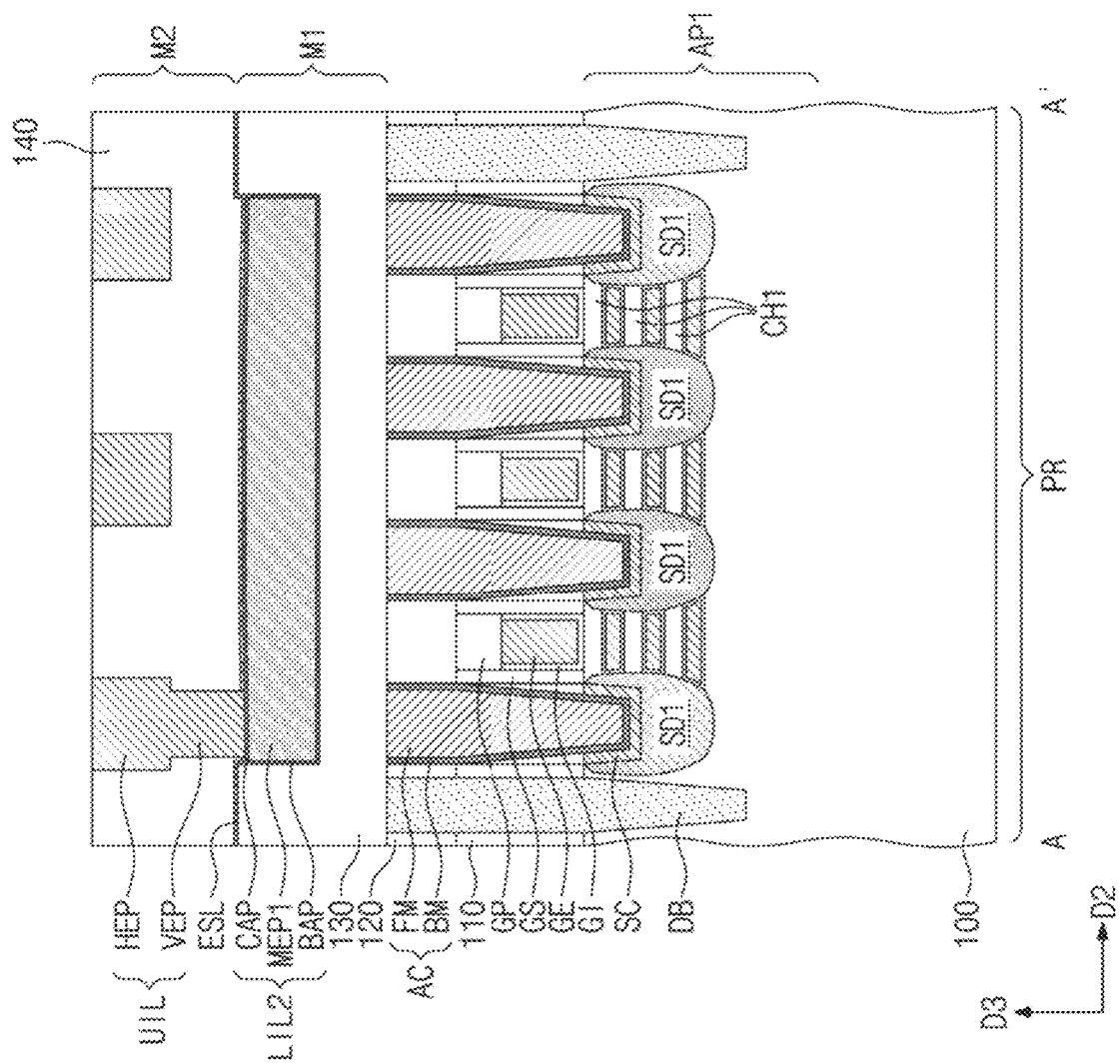
FIGS. 23A to 23D are sectional views, which are respectively taken along lines A-A', B-B', C-C' and D-D' of FIG. 1 to illustrate a semiconductor device according to some example embodiments of the inventive concepts.
Figure 23B:
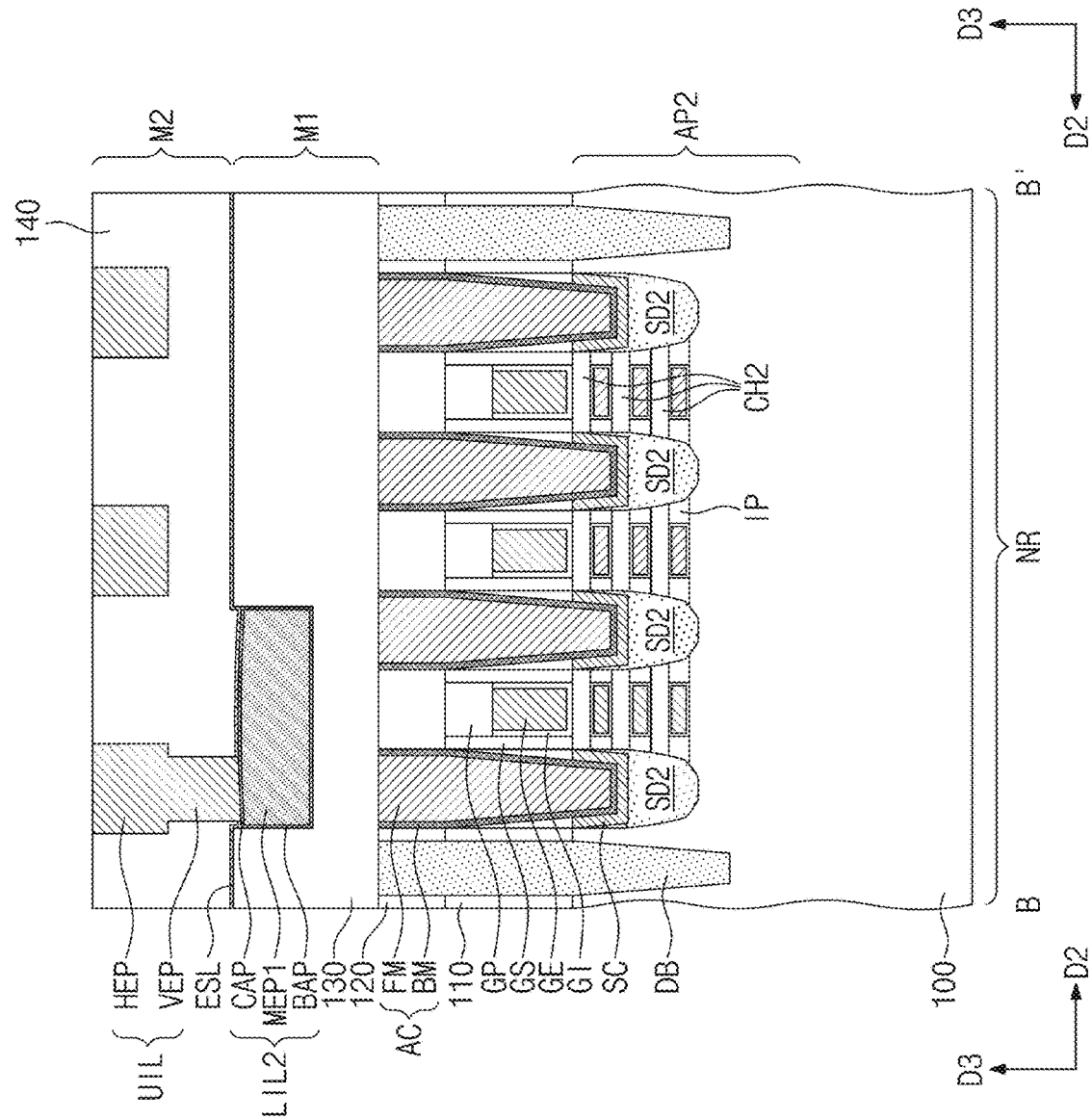
Figure 23C:
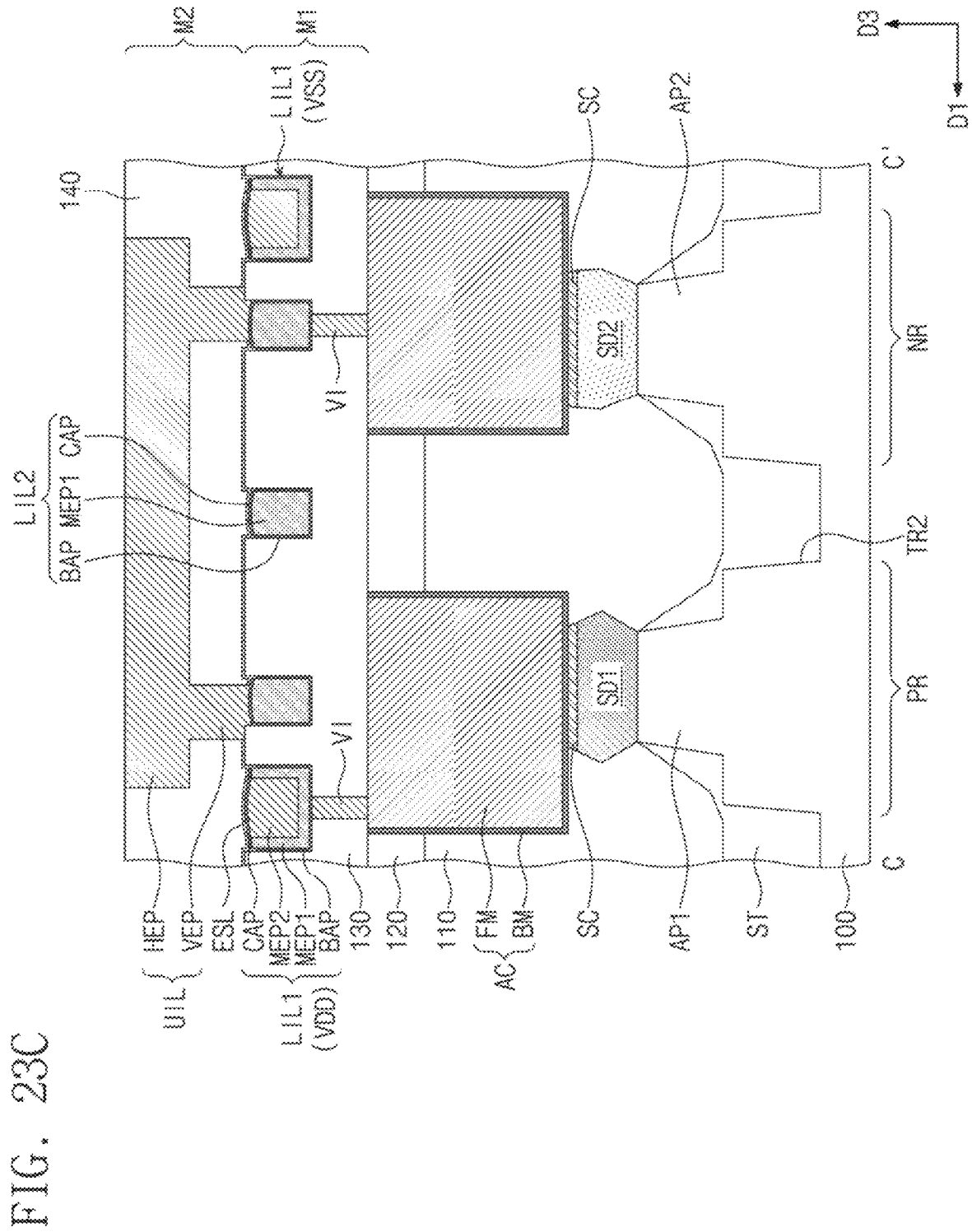
Figure 23D:
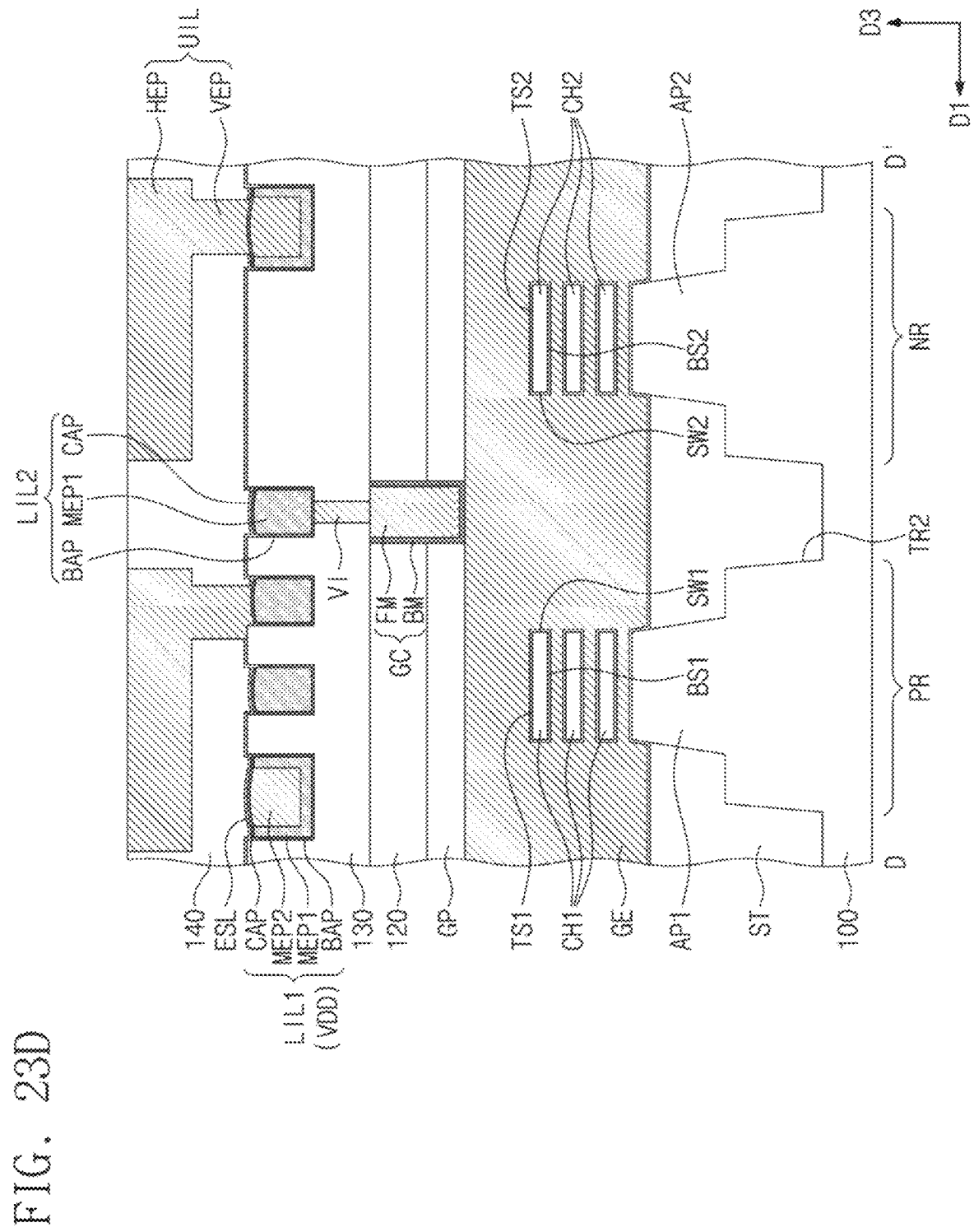

The gate electrode GE may be provided to surround each of the first and second channel patterns CH1 and CH2 (e.g., see FIG. 23D). The gate electrode GE may be provided on a first top surface TS1, at least one first side surface SW1, and a first bottom surface BS1 of the first channel pattern CH1. The gate electrode GE may be provided on a second top surface TS2, at least one second side surface SW2, and a second bottom surface BS2 of the second channel pattern CH2. In other words, the gate electrode GE may surround a top surface, a bottom surface and both side surfaces of each of the first and second channel patterns CH1 and CH2. The transistor according to some example embodiments may be a three-dimensional field effect transistor (e.g., a multi-bridge channel field-effect transistor (MBCFET)), in which the gate electrode GE is disposed to three-dimensionally surround the channel patterns CH1 and CH2.

The gate dielectric pattern GI may be provided between each of the first and second channel patterns CH1 and CH2 and the gate electrode GE. The gate dielectric pattern GI may surround each of the first and second channel patterns CH1 and CH2.

On the second active region NR, an insulating pattern IP may be interposed between the gate dielectric pattern GI and the second source/drain pattern SD2. The gate electrode GE may be spaced apart from the second source/drain pattern SD2 by the gate dielectric pattern GI and the insulating pattern IP. By contrast, on the first active region PR, the insulating pattern IP may be omitted.

The first interlayered insulating layer 110 and the second interlayered insulating layer 120 may be provided to cover the substrate 100. The active contacts AC may be provided to penetrate the first and second interlayered insulating layers 110 and 120 and may be connected to the first and second source/drain patterns SD1 and SD2, respectively. The gate contact GC may be provided to penetrate the second interlayered insulating layer 120 and the gate capping pattern GP and may be connected to the gate electrode GE.

The third interlayered insulating layer 130 may be provided on the second interlayered insulating layer 120. The fourth interlayered insulating layer 140 may be provided on the third interlayered insulating layer 130. The first metal layer M1 may be provided in the third interlayered insulating layer 130. The second metal layer M2 may be provided in the fourth interlayered insulating layer 140. The first metal layer M1 and the second metal layer M2 may be the same or substantially the same as those in the previous example embodiments described with reference to FIGS. 1 and 2A to 2D.

In a semiconductor device according to some example embodiments of the inventive concepts, metallic materials for interconnection lines may be selected to optimize or reduce resistivity characteristics of the interconnection lines, in consideration of linewidths of the interconnection lines and the nonlinearity of resistivity. An interconnection line, whose linewidth and pitch are small, may be formed to have a top surface that is lower than a top surface of an interlayered insulating layer, and thus, it may be possible to reduce or prevent a short circuit issue, which may occur when the via is formed in an offset manner. Accordingly, electric characteristics of the semiconductor device may be improved.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising
transistors on a substrate;
an interlayered insulating layer on the transistors; and
a first interconnection line, a second interconnection line, and a third interconnection line that are in an upper portion of the interlayered insulating layer,
wherein a linewidth of the first interconnection line is larger than a linewidth of the second interconnection line,
a linewidth of the third interconnection line is smaller than a linewidth of the second interconnection line,
each of the first and second interconnection lines includes a first metal pattern and a second metal pattern on the first metal pattern, the second metal pattern containing a metallic material different from the first metal pattern,
a volume ratio of the first metal pattern in the first interconnection line to a total volume of the first interconnection line is smaller than a volume ratio of the first metal pattern in the second interconnection line to a total volume of the second interconnection line,
a volume ratio of the second metal pattern in the first interconnection line to the total volume of the first interconnection line is greater than a volume ratio of the second metal pattern in the second interconnection line to the total volume of the second interconnection line, and
the third interconnection line includes the first metal pattern and exclude the second metal pattern.

2. The semiconductor device of claim 1, wherein the first metal pattern comprises a metallic material whose electron mean free path (eMFP) is smaller than 12 nm, and
the second metal pattern comprises a metallic material whose eMFP is larger than 12 nm.

3. The semiconductor device of claim 2, wherein the first metal pattern comprises ruthenium (Ru), cobalt (Co), tungsten (W), or molybdenum (Mo), and
the second metal pattern comprises copper (Cu).

4. The semiconductor device of claim 1, wherein each of the first and second interconnection lines further includes a barrier metal pattern between the interlayered insulating layer and the first metal pattern, and
an upper portion of the barrier metal pattern is recessed to define a recess region between the interlayered insulating layer and the first metal pattern.

5. The semiconductor device of claim 1, wherein each of the first and second interconnection lines further includes a metal capping pattern covering a top surface of the first metal pattern and a top surface of the second metal pattern, and
the metal capping pattern comprises ruthenium (Ru), cobalt (Co), or graphene.

6. The semiconductor device of claim 1, wherein each of the first and second interconnection lines further includes a via portion as a lower portion thereof, and
the second metal pattern is absent in the via portion.

7. The semiconductor device of claim 1, wherein the first metal pattern of each of the first and second interconnection lines includes a lower portion and a pair of upper portions vertically extended from the lower portion, and
the second metal pattern is in a space enclosed by the lower portion and the pair of upper portions.

8. The semiconductor device of claim 1, wherein a highest level of a top surface of the third interconnection line is lower than a highest level of a top surface of the first interconnection line.

9. The semiconductor device of claim 1, wherein the second metal pattern has a largest volume in the first interconnection line, and
the first metal pattern has a largest volume in the third interconnection line.

10. A semiconductor device, comprising
transistors on a substrate;
an interlayered insulating layer on the transistors; and
an interconnection line in an upper portion of the interlayered insulating layer, wherein the interconnection line includes a barrier metal pattern, a first metal pattern on the barrier metal pattern and a second metal pattern on the first metal pattern, the second metal pattern having a first uppermost surface level, the first metal pattern having a second uppermost surface level lower than the first uppermost surface level, and the barrier metal pattern having a third uppermost surface level lower than the second uppermost surface level, the second metal pattern contains a metallic material different from the first metal pattern, the interconnection line further includes a via portion in a lower portion of the interlayered insulating layer, the via portion vertically extending toward a lower metal layer, the via portion includes the barrier metal pattern and the first metal pattern and excludes the second metal pattern.

11. The semiconductor device of claim 10, wherein a thickness of an upper portion of the first metal pattern of the interconnection line in a horizontal direction is a first thickness, a thickness of the first metal pattern of the via portion in the horizontal direction is a second thickness, and the second thickness is larger than two times the first thickness.

12. The semiconductor device of claim 10, wherein the barrier metal pattern is between the interlayered insulating layer and the first metal pattern.

13. The semiconductor device of claim 10, wherein the first metal pattern includes a lower portion and a pair of upper portions vertically extended from the lower portion, the second metal pattern is in a space enclosed by the lower portion and the pair of upper portions, and the via portion is extended from the lower portion.

14. The semiconductor device of claim 10, wherein the first metal pattern comprises a metallic material whose electron mean free path (eMFP) is smaller than 12 nm, and the second metal pattern comprises a metallic material whose eMFP is larger than 12 nm.

* * * * *